US012651696B2

(12) United States Patent

Xie et al.

(10) Patent No.: US 12,651,696 B2

(45) Date of Patent: Jun. 9, 2026

(54) POWER MODULE AND SOLID-STATE TRANSFORMER SYSTEM

(71) Applicant: Delta Electronics (Shanghai) Co., Ltd., Shanghai (CN)

(72) Inventors: Yicong Xie, Shanghai (CN); Peng Ma, Shanghai (CN); Weiqiang Zhang, Shanghai (CN)

(73) Assignee: Delta Electronics (Shanghai) Co., Ltd., Shanghai (CN)

( * ) Notice: Subject to any disclaimer, the term of this patent is extended or adjusted under 35 U.S.C. 154(b) by 877 days.

(21) Appl. No.: 17/812,433

(22) Filed: Jul. 13, 2022

(65) Prior Publication Data

US 2023/0015821 A1 Jan. 19, 2023

(30) Foreign Application Priority Data

Jul. 19, 2021 (CN) .......................... 202110815515.7

(51) Int. Cl.
| | |
|---|---|
| *H01F 27/36* | (2006.01) |
| *H01F 27/22* | (2006.01) |
| *H05K 9/00* | (2006.01) |

(52) U.S. Cl.
CPC .......... *H01F 27/363* (2020.08); *H01F 27/22* (2013.01); *H05K 9/0043* (2013.01); *H05K 9/0088* (2013.01)

(58) Field of Classification Search
CPC ... H01F 27/363; H05K 9/0088; H05K 9/0043
See application file for complete search history.

(56) References Cited

U.S. PATENT DOCUMENTS

| | | | |
|---|---|---|---|
| 4,942,380 A | 7/1990 | Bradford et al. | |
| 5,374,779 A | * 12/1994 | Konishi | ................. H04B 15/02 |
| | | | 174/384 |

(Continued)

FOREIGN PATENT DOCUMENTS

| | | |
|---|---|---|
| CN | 1326201 A | 12/2001 |
| CN | 101071895 A | 11/2007 |

(Continued)

OTHER PUBLICATIONS

Corresponding extended European search report issued on Dec. 23, 2022.

(Continued)

*Primary Examiner* — Hung V Ngo

(74) *Attorney, Agent, or Firm* — CKC & Partners Co., LLC

(57) ABSTRACT

The present disclosure provides a power module and a solid-state transformer system. The power module includes: a circuit module, having a voltage level; and a cabin, configured to wrap the circuit module by bending or splicing, where the cabin has a shielding structure, the shielding structure including: a first conductor layer, located at a side close to the circuit module and equipotentially connected to the circuit module; a second conductor layer, arranged apart from the first conductor layer and located at a side away from the circuit module; and a solid insulating layer, provided between the first conductor layer and the second conductor layer for electrically isolating the first conductor layer and the second conductor layer. The power module provided by the present disclosure has good insulation performance and is easy to assemble.

19 Claims, 17 Drawing Sheets

(56)                References Cited

U.S. PATENT DOCUMENTS

| | | | |
|---|---|---|---|
| 6,351,202 | B1 | 2/2002 | Ito et al. |
| 2004/0222511 | A1* | 11/2004 | Zhang .................... H01L 23/552 |
| | | | 257/E23.114 |
| 2010/0109830 | A1 | 5/2010 | Hanser |
| 2016/0057901 | A1 | 2/2016 | Sargeant et al. |
| 2017/0027090 | A1 | 1/2017 | Sumi et al. |
| 2018/0054114 | A1 | 2/2018 | Wu et al. |
| 2018/0153046 | A1 | 5/2018 | Xie et al. |
| 2018/0183400 | A1 | 6/2018 | Mizutani |
| 2019/0304664 | A1 | 10/2019 | Oh et al. |
| 2019/0362887 | A1 | 11/2019 | Yang et al. |
| 2020/0082975 | A1 | 3/2020 | Yang et al. |
| 2020/0187394 | A1 | 6/2020 | Murugesan et al. |
| 2020/0253581 | A1 | 8/2020 | Kubota et al. |
| 2022/0108829 | A1 | 4/2022 | Sho et al. |
| 2022/0110229 | A1 | 4/2022 | Koh et al. |
| 2022/0407433 | A1* | 12/2022 | Liu ....................... H05K 7/2089 |

FOREIGN PATENT DOCUMENTS

| | | | |
|---|---|---|---|
| CN | 101606209 | A | 12/2009 |
| CN | 101626676 | A | 1/2010 |
| CN | 101902886 | A | 12/2010 |
| CN | 102510712 | A | 6/2012 |
| CN | 104754929 | A | 7/2015 |
| CN | 101873762 | B | 8/2015 |
| CN | 105074487 | A | 11/2015 |
| CN | 107018646 | A | 8/2017 |
| CN | 104900634 | B | 3/2018 |
| CN | 108831716 | A | 11/2018 |
| CN | 110784995 | A | 2/2020 |
| CN | 112032550 | A | 12/2020 |
| DE | 202013007444 | U1 | 10/2013 |
| EP | 0936045 | A1 | 8/1999 |
| JP | H08139483 | A | 5/1996 |
| JP | H10150288 | A | 6/1998 |
| JP | 2008172015 | A | 7/2008 |
| JP | 2013172102 | A | 9/2013 |
| KR | 101198031 | B1 | 11/2012 |
| WO | 2010134552 | A1 | 11/2010 |
| WO | 2020164085 | A1 | 8/2020 |

OTHER PUBLICATIONS

The NOA of corresponding U.S. Appl. No. 17/807,384, dated May 2, 2025.

The Office Action of corresponding Chinese application No. 202110815515.7, dated Aug. 14, 2025.

The Office Action of corresponding Chinese application No. 202110815515.7, dated Apr. 3, 2025.(20 pages).

The Office Action of corresponding Chinese application No. 202110815506.8, dated Mar. 4, 2026.

The Notice of Allowance of corresponding Chinese application No. 202110815515.7, dated Feb. 12, 2026.

Zhao Huichun, "Research on the Inner Shielding Structure of High Voltage Generator Insulation Design", Heilongjiang Science and Technology Information, Issue 03, Jan. 25, 2008.

Liao Qiaosheng et al., "Simulation of In-bore High Magnetic Shielding for Railgun Projectile", Journal of Gun Launch&Control, vol. 37 No. 2, Jun. 2016.

* cited by examiner

1

21
20
22
10

220
230
210

10          21

201

21

202

10

12

30

40

21a

POWER MODULE AND SOLID-STATE TRANSFORMER SYSTEM

CROSS-REFERENCE TO RELATED APPLICATIONS

This application claims priority to Chinese Patent Application No. 202110815515.7, filed on Jul. 19, 2021, which is hereby incorporated by reference in its entirety.

TECHNICAL FIELD

The present disclosure relates to the technical field of power electronics, and in particular, to a power module and a solid-state transformer system.

BACKGROUND

In recent years, with the evolution of distribution network to smart grid, through a modularization strategy, high-power power electronic conversion apparatuses have been widely used in the fields of power quality control, energy storage, power transmission, and new energy including solar energy and wind energy, etc., thereby deriving medium voltage conversion apparatuses for transmission lines of related power systems. The definition of medium voltage is broad, usually ranging from 2.4 to 69 KV, and typical values of the medium voltage in China, the United States, and Europe are 10 KV, 13.8 KV and 20 KV respectively.

Compared with conventional air insulation, solid insulation has the advantages of high breakdown field strength, uniform electric field, and easy control of field strength. The use of solid insulation may save the insulation space between power modules, keep the advantage of high power density for power modules applied in the medium voltage field, strengthen insulation reliability and mechanism protection at the same time, and simplify installation steps.

In existing power modules, an insulating cabin is prepared with casting molding using traditional epoxy resin. Since space of preformed insulating cabin is limited, it is difficult to improve installation accuracy, and it is also difficult to connect various connectors (e.g., optical fibers). In addition, in order to improve the power density of a power module, it is necessary to further reduce the thickness of an insulating cabin. However, it is difficult for a mold casting process of traditional epoxy resin to ensure a good yield of a thin insulating cabin (cabin thickness <6 mm).

Therefore, it is urgent to develop a power module, so that the cabin structure of the power module not only has the solid insulation characteristics of traditional epoxy resin, but also meets the requirements of simplifying installation steps and flexibly adapting to the shape of the module.

SUMMARY

In view of the above problems, the present disclosure aims to provide a power module and a solid-state transformer system with good insulation performance and easy assembly.

A first aspect of embodiments of the present disclosure provides a power module, the power module including: a circuit module, having a voltage level; and a cabin, configured to wrap the circuit module by bending or splicing, where the cabin has a shielding structure, the shielding structure including: a first conductor layer, the first conductor layer being located at a side close to the circuit module and equipotentially connected to the circuit module; a second conductor layer, the second conductor layer being arranged apart from the first conductor layer and located at a side away from the circuit module; and a solid insulating layer, provided between the first conductor layer and the second conductor layer and configured to electrically isolate the first conductor layer and the second conductor layer.

In some optional implementations, the shielding structure is flexible.

In some optional implementations, the shielding structure includes a flexible shielding section and a rigid shielding section, and the flexible shielding section and the rigid shielding section are alternately arranged and connected end to end.

In some optional implementations, at least one flexible shielding section is arranged at a corner between two adjacent external surfaces of the circuit module.

In some optional implementations, the shielding structure includes a plurality of shielding sections, the shielding sections being arranged along a circumferential direction of the circuit module, and the shielding structure has an opening, the opening being formed between two adjacent shielding sections.

In some optional implementations, the opening is located at a corner between two adjacent external surfaces of the circuit module.

In some optional implementations, the power module further includes an insulator. The insulator is arranged around the circuit module and at least covers the opening, and the insulator is located at each side of the cabin.

In some optional implementations, the cabin further has an insulator, provided at the opening and connected between two adjacent shielding sections, and the insulator is integrated with the solid insulating layer of the shielding structure.

In some optional implementations, the shielding structure further includes a plurality of third conductor layers arranged at intervals, the plurality of third conductor layers are located between the first conductor layer and the second conductor layer. Ends of the first conductor layer, ends of the plurality of third conductor layers, and ends of the second conductor layer gradually expand from the side close to the circuit module to the side away from the circuit module.

In some optional implementations, the circuit module has a concave part arranged opposite to the opening.

In some optional implementations, the shielding structure further includes a plurality of third conductor layers arranged at intervals, and at least one layer of the plurality of third conductor layers is arranged outside the shielding structure and is configured as a signal transmission layer.

In some optional implementations, the first conductor layer is a metal layer, a semi-conductive layer, or a composite structure of metal layer and semi-conductive layer.

In some optional implementations, the second conductor layer is a metal layer, a semi-conductive layer, or a composite structure of metal layer and semi-conductive layer.

In some optional implementations, the cabin is prepared and formed by a printed circuit board process.

A second aspect of embodiments of the present disclosure provides a power module, the power module including: a first circuit module, having a first voltage level; a first cabin, configured to wrap the first circuit module, where the first cabin has a first shielding structure, and the first shielding structure is the shielding structure of the power module according to the first aspect, and the first conductor layer of the first shielding structure is equipotentially connected to the first circuit module; and a second circuit module, juxtaposed with or surrounding the first circuit module, where the second circuit module has a second voltage level, and the second voltage level is lower than the first voltage level.

In some optional implementations, the power module further includes a second cabin, configured to wrap the second circuit module, and the second cabin has a second shielding structure, where the second shielding structure includes: a fourth conductor layer, where the forth conductor layer is located at a side close to the second circuit module and is equipotentially connected to the second circuit module; a fifth conductor layer, where the fifth conductor layer is arranged apart from the fourth conductor layer and located at a side away from the second circuit module; and an insulating layer, provided between the fourth conductor layer and the fifth conductor layer, and configured to electrically isolate the fourth conductor layer and the fifth conductor layer.

In some optional implementations, the first cabin and the second cabin are juxtaposed, and there is a common part between the first cabin and the second cabin.

In some optional implementations, the common part has a common conductor layer, where the common conductor layer is electrically coupled to a reference potential, and a voltage of the reference potential is between the first voltage level and the second voltage level.

In some optional implementations, the first shielding structure includes a plurality of first shielding sections and the second shielding structure includes a plurality of second shielding sections.

In some optional implementations, the common part is rigid and is connected between two flexible first shielding sections and two flexible second shielding sections.

In some optional implementations, two ends of the first cabin are casted with insulating glue and provided with a vent hole, and the vent hole is configured to form an air duct in the first cabin.

In some optional implementations, the power module further includes a heat sink, provided in the first cabin and exposed to the air duct, and the first circuit module is arranged around the heat sink.

A third aspect of embodiments of the present disclosure provides a solid-state transformer system, including the power module of the second aspect.

BRIEF DESCRIPTION OF DRAWINGS

In order to describe the technical solutions of the embodiments in the present disclosure or in the prior art more clearly, the drawings required in descriptions of the embodiments or the prior art are briefly introduced below. Obviously, the drawings in the following descriptions are some embodiments of the present disclosure, and for persons with ordinary skills in the art, other drawings may be obtained according to these drawings without creative efforts.

DESCRIPTION OF EMBODIMENTS

In order to make the objectives, features, and advantages of the embodiments of the present disclosure clearer, the technical solutions of the embodiments of the present disclosure will be described clearly and completely in conjunction with the drawings of the embodiments of the present disclosure. Obviously, embodiments that are described are part of the embodiments of the present disclosure, not all of the embodiments. Based on the embodiments of the present disclosure, all other embodiments obtained by persons with ordinary skills in the art without creative efforts belong to protection scope of the present disclosure.

In the prior art, an insulating cabin of a power module is prefabricated, and the power module is assembled by respectively installing components, such as a high-voltage circuit unit, a low-voltage circuit unit, a high-voltage coil, and a low-voltage coil, in the insulating cabin. However, the insulating cabin usually has a long and narrow cylindrical structure, and the process mentioned above is not convenient for installation and positioning of various components of the power module.

In view of this, the embodiments of the present disclosure provide a power module, the power module including a cabin and a circuit module provided in the cabin, where the cabin has a splicing structure or the cabin is bendable, so that the cabin may be fixed on an external surface of the circuit module after the circuit module is assembled, which is convenient for assembly.

Figure 1:
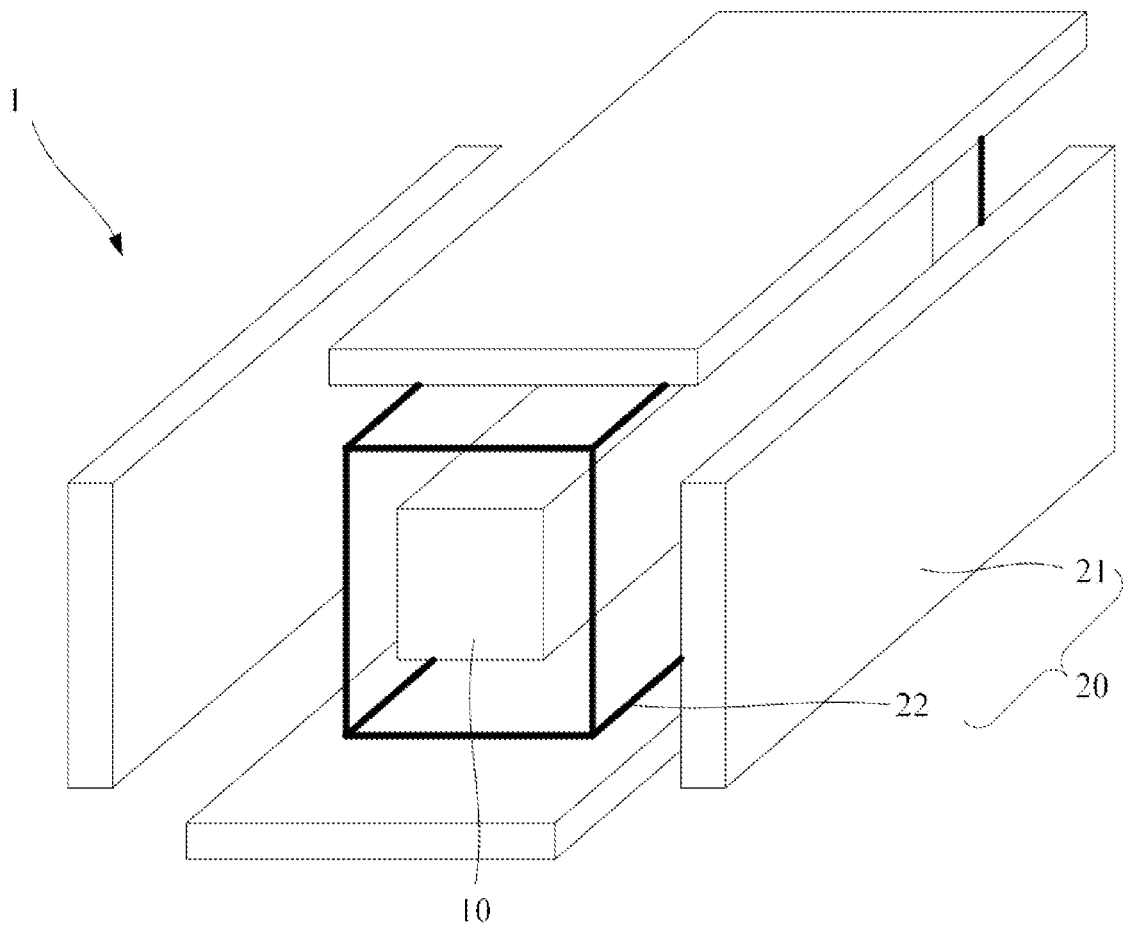
FIG. 1 is a schematic structural diagram of a power module provided by an embodiment of the present disclosure.
Figure 2:
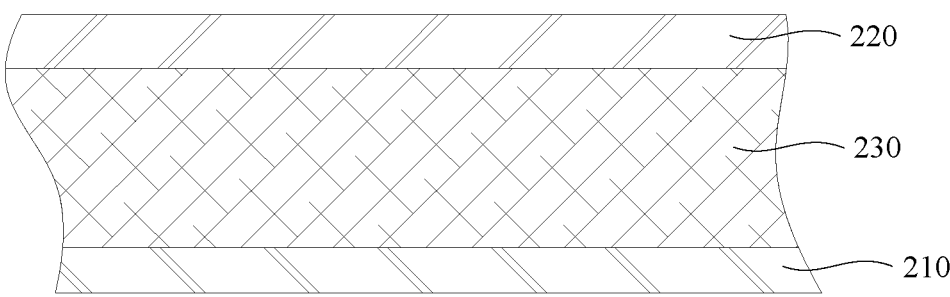
FIG. 2 is a schematic structural diagram of a shielding structure in FIG. 1.
Figure 3:
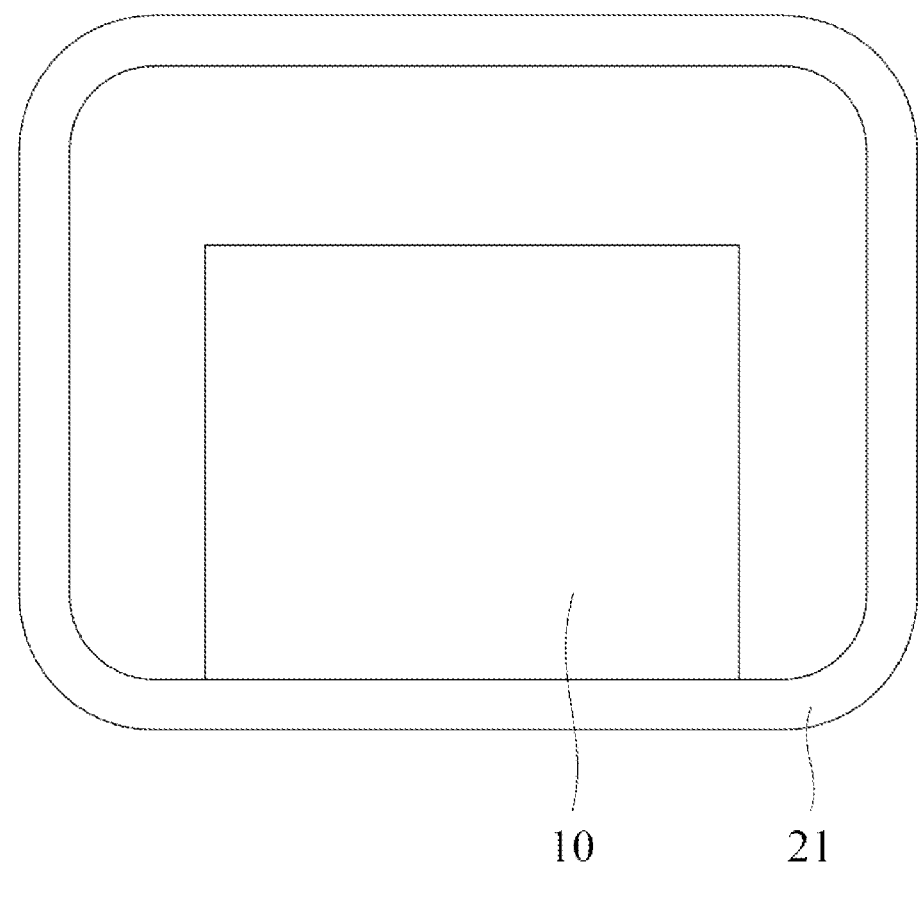
FIG. 3 is a schematic structural diagram when the shielding structure in FIG. 1 is flexible.
Figure 4:
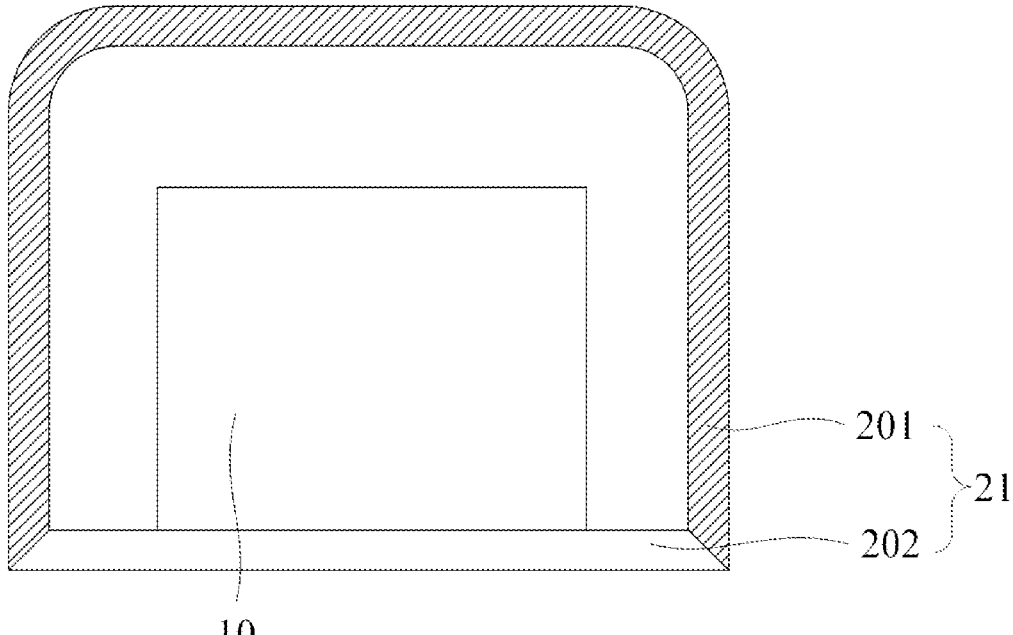
FIG. 4 is a first schematic structural diagram when the shielding structure in FIG. 1 includes a rigid shielding section and a flexible shielding section.
Figure 5:
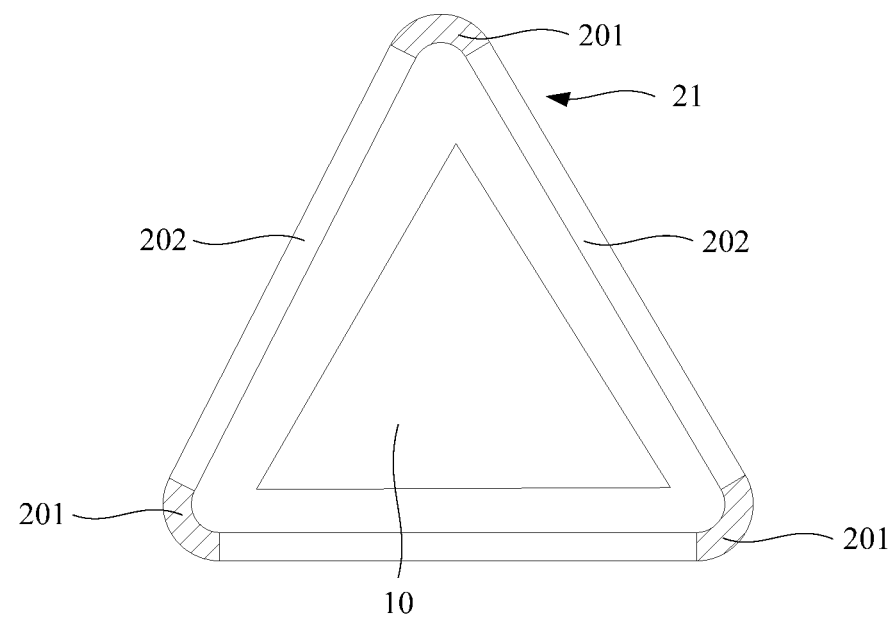
FIG. 5 is a second schematic structural diagram when the shielding structure in FIG. 1 includes a rigid shielding section and a flexible shielding section.
Figure 6:
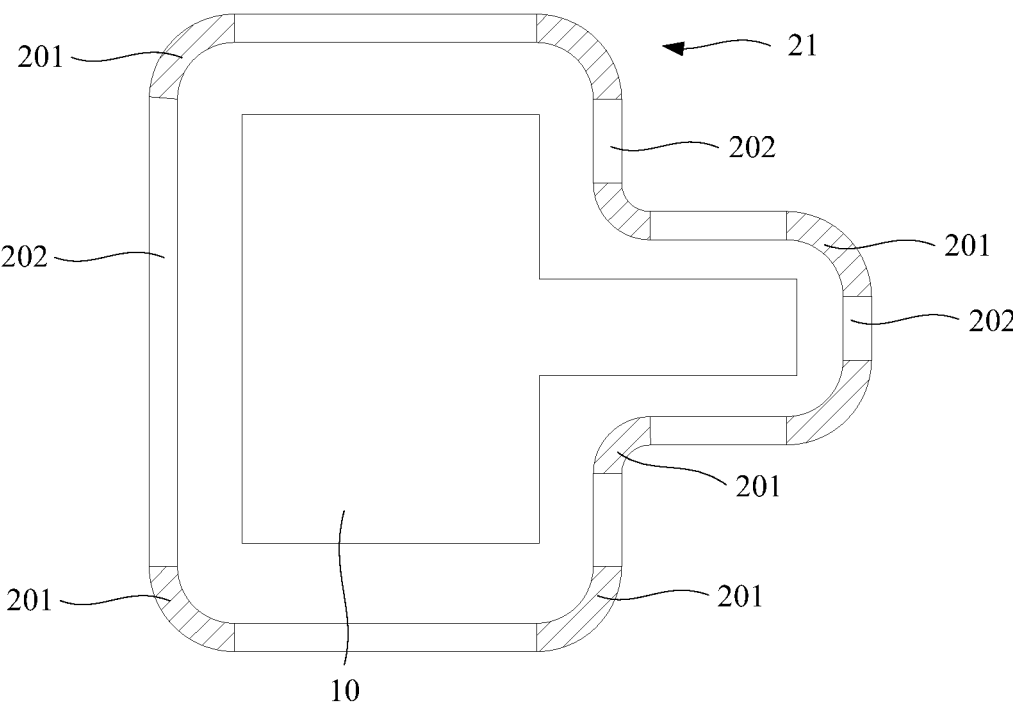
FIG. 6 is a third schematic structural diagram when the shielding structure in FIG. 1 includes a rigid shielding section and a flexible shielding section.
Figure 7:
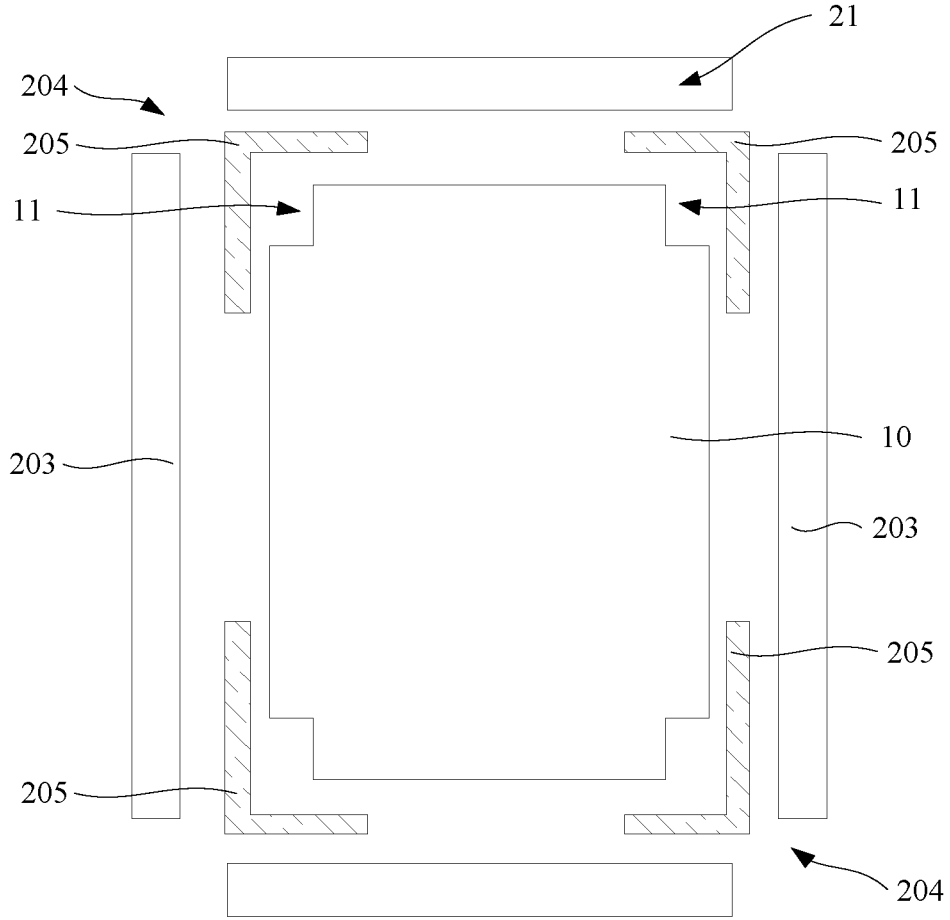
FIG. 7 is a first schematic structural diagram when the shielding structure in FIG. 1 includes a plurality of shielding sections.
Figure 8:
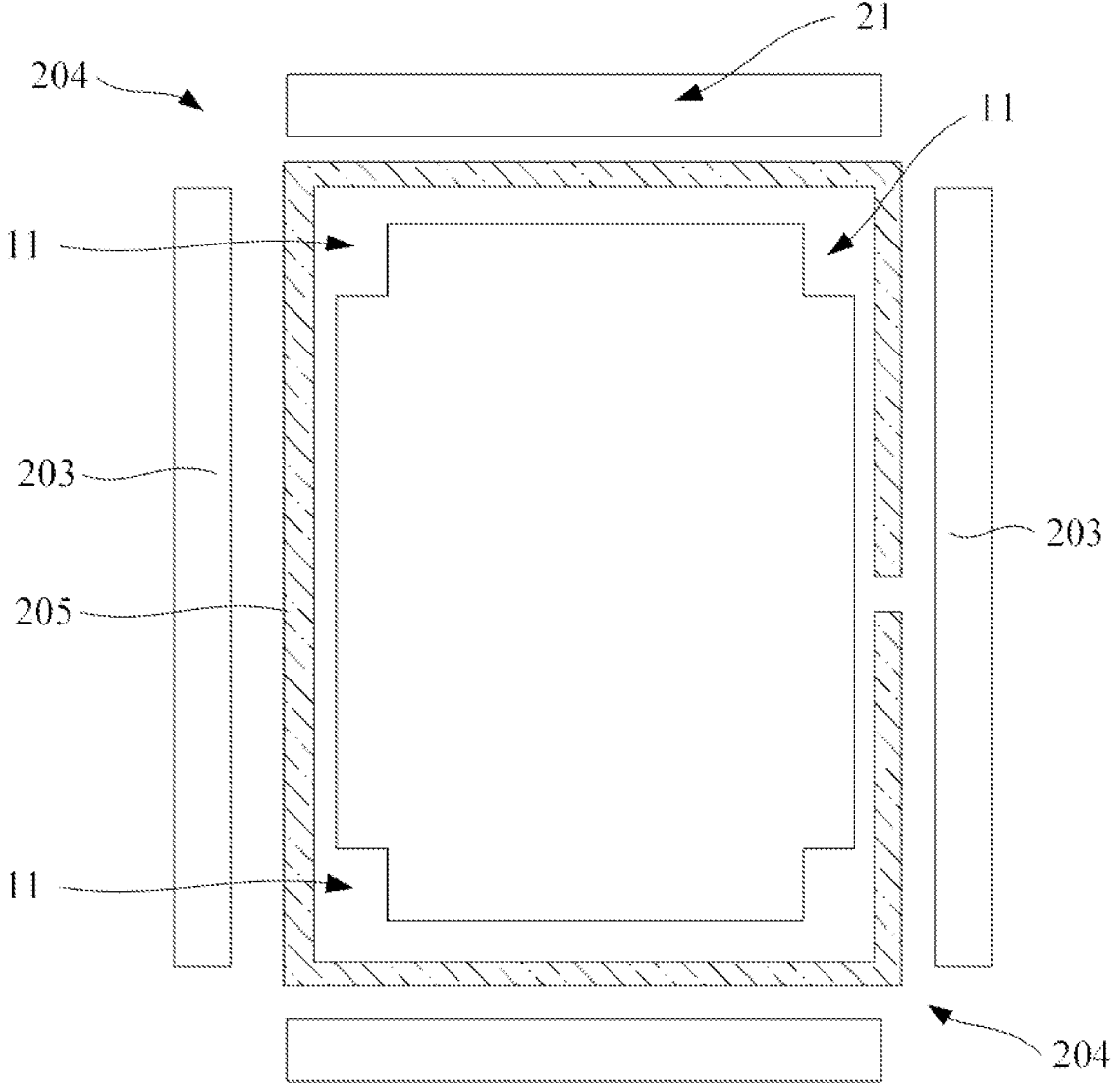
FIG. 8 is a second schematic structural diagram when the shielding structure in FIG. 1 includes a plurality of shielding sections.
Figure 9:
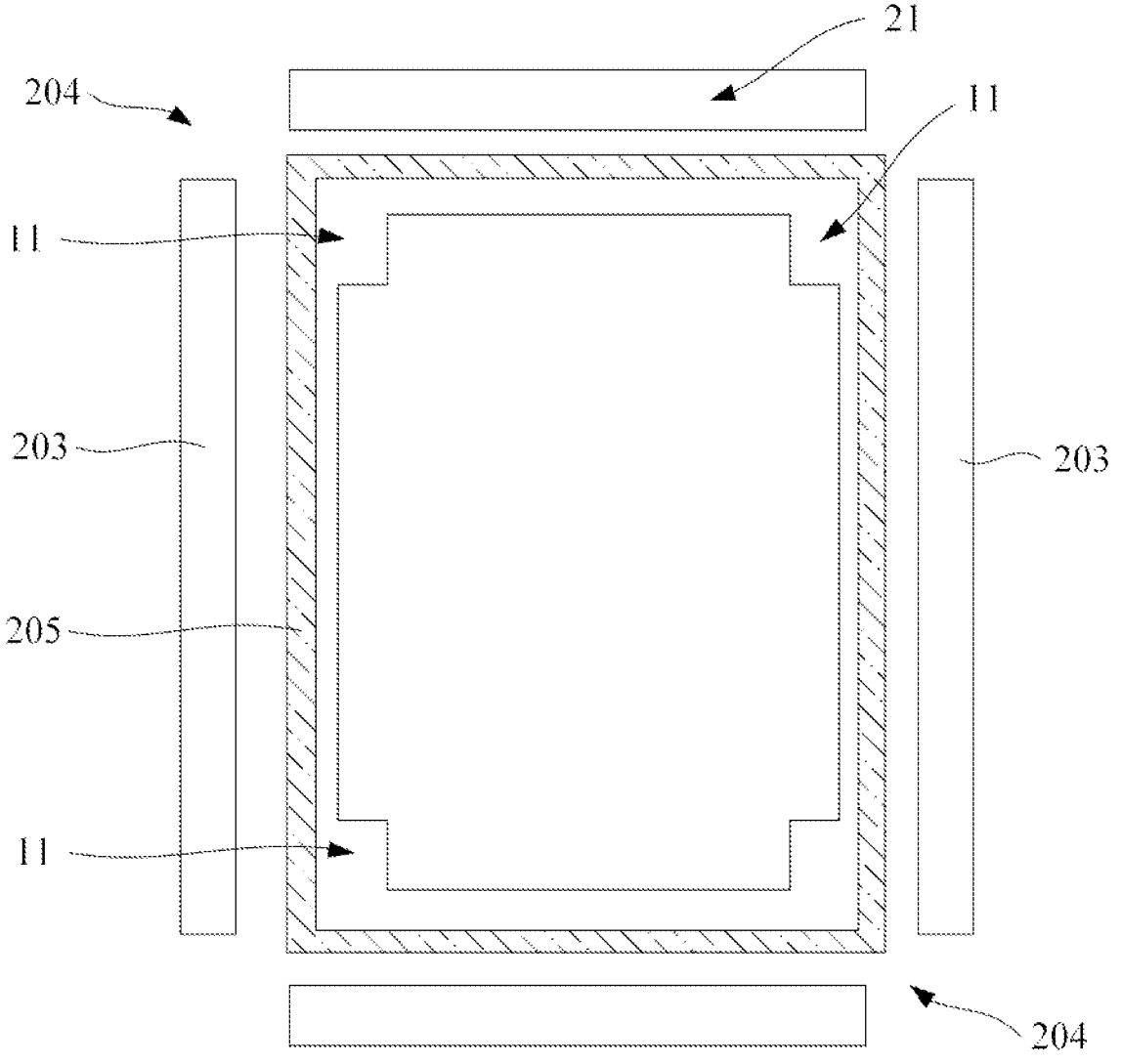
FIG. 9 is a third schematic structural diagram when the shielding structure in FIG. 1 includes a plurality of shielding sections.
Figure 10:
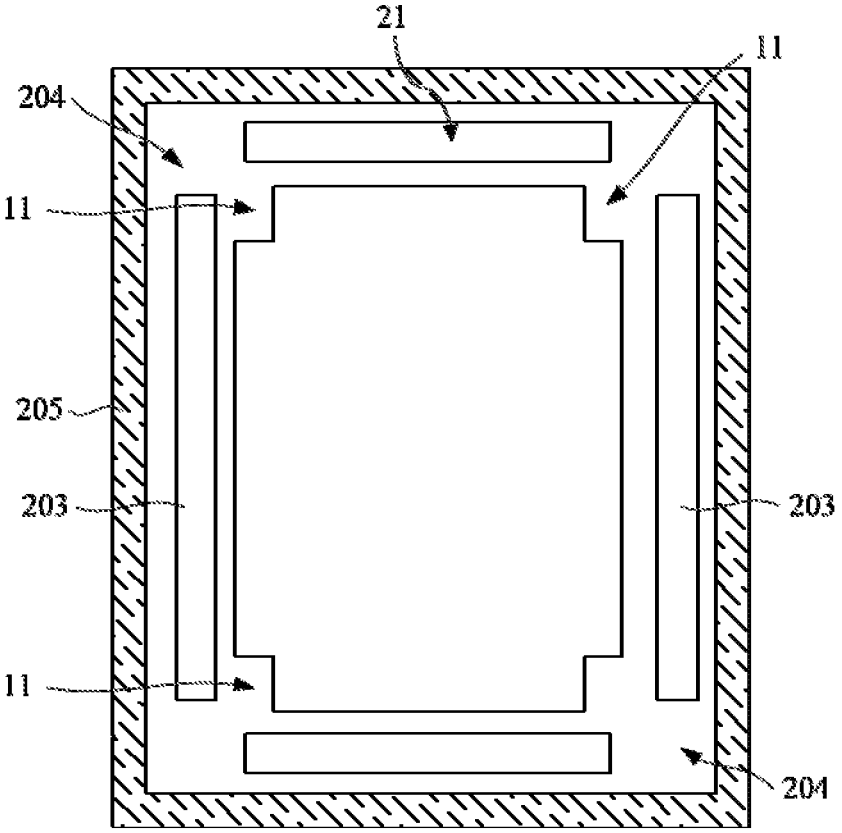
FIG. 10 is a fourth schematic structural diagram when the shielding structure in FIG. 1 includes a plurality of shielding sections.
Figure 11:
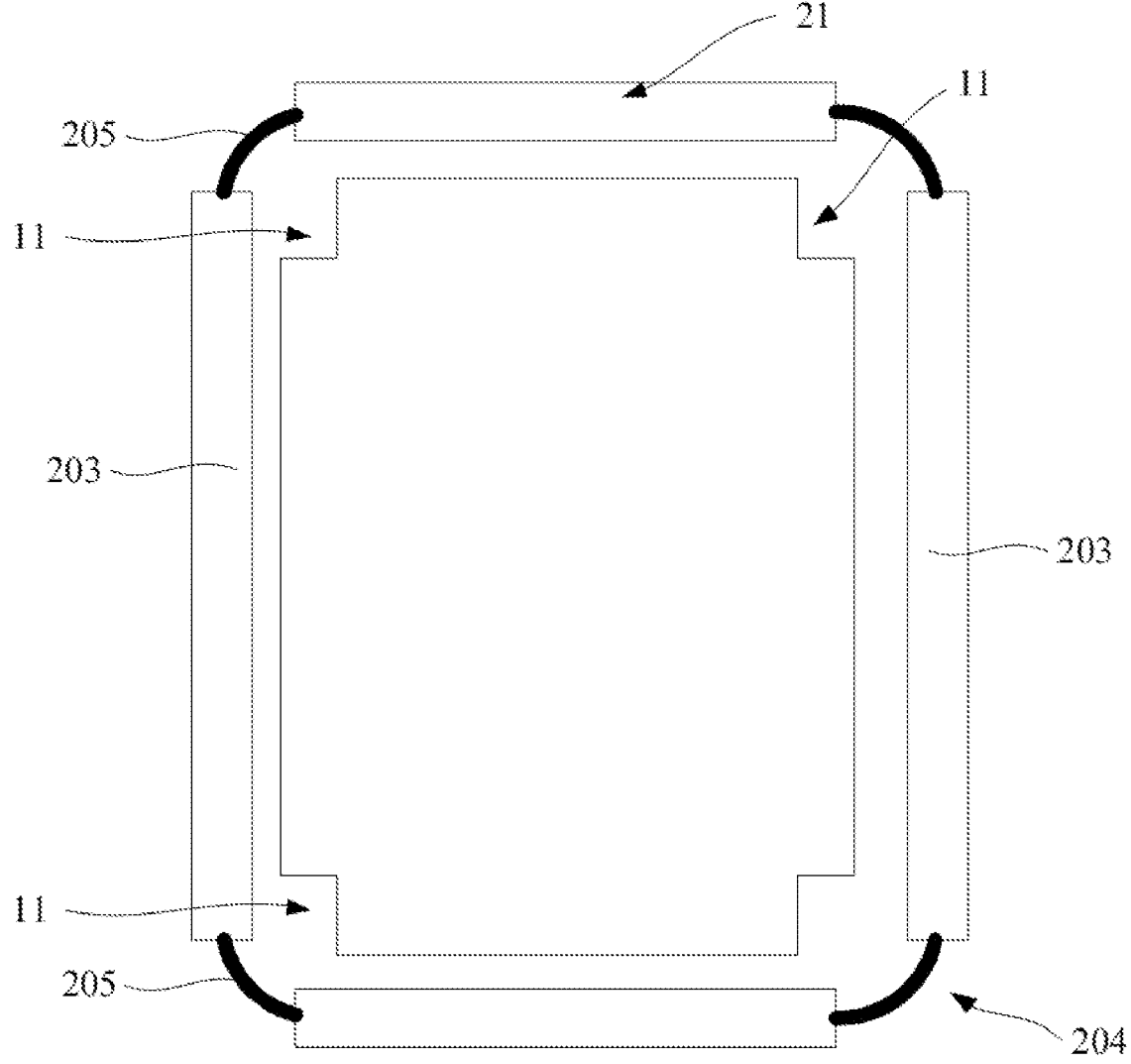
FIG. 11 is a fifth schematic structural diagram when the shielding structure in FIG. 1 includes a plurality of shielding sections.
Figure 12:
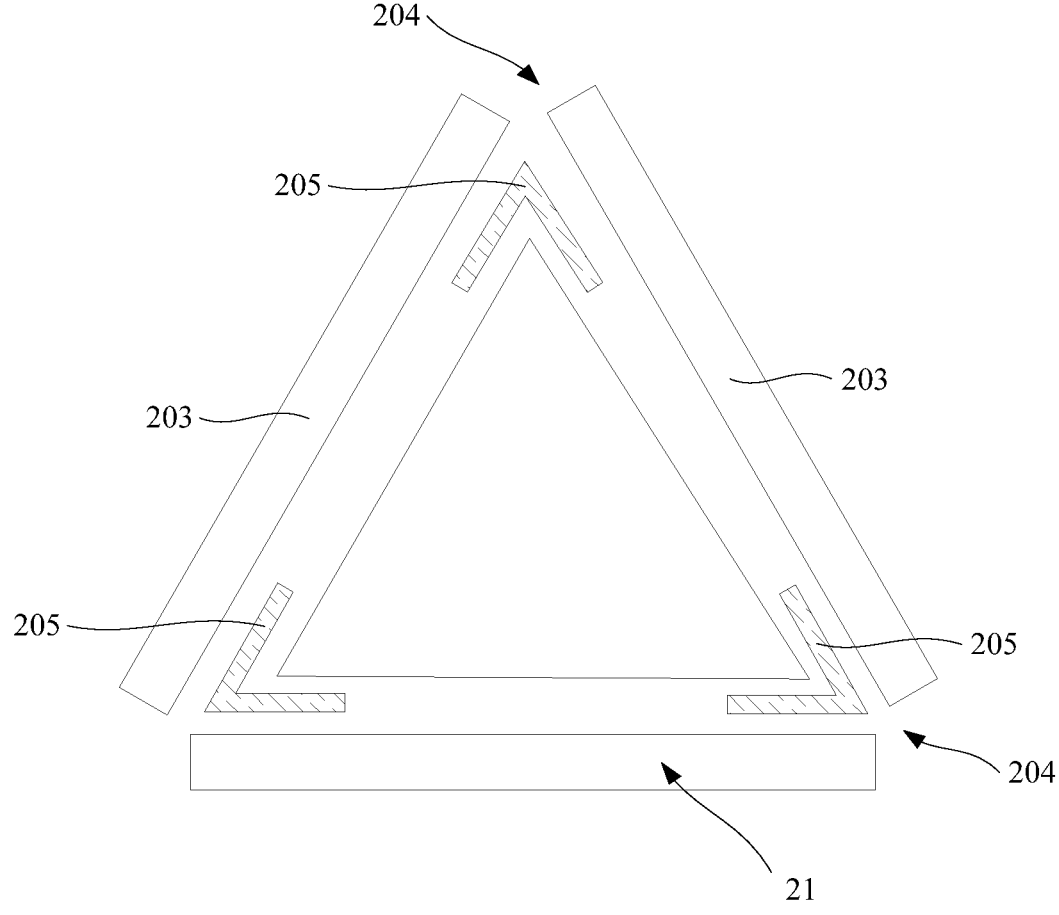
FIG. 12 is a sixth schematic structural diagram when the shielding structure in FIG. 1 includes a plurality of shielding sections.
Figure 13:
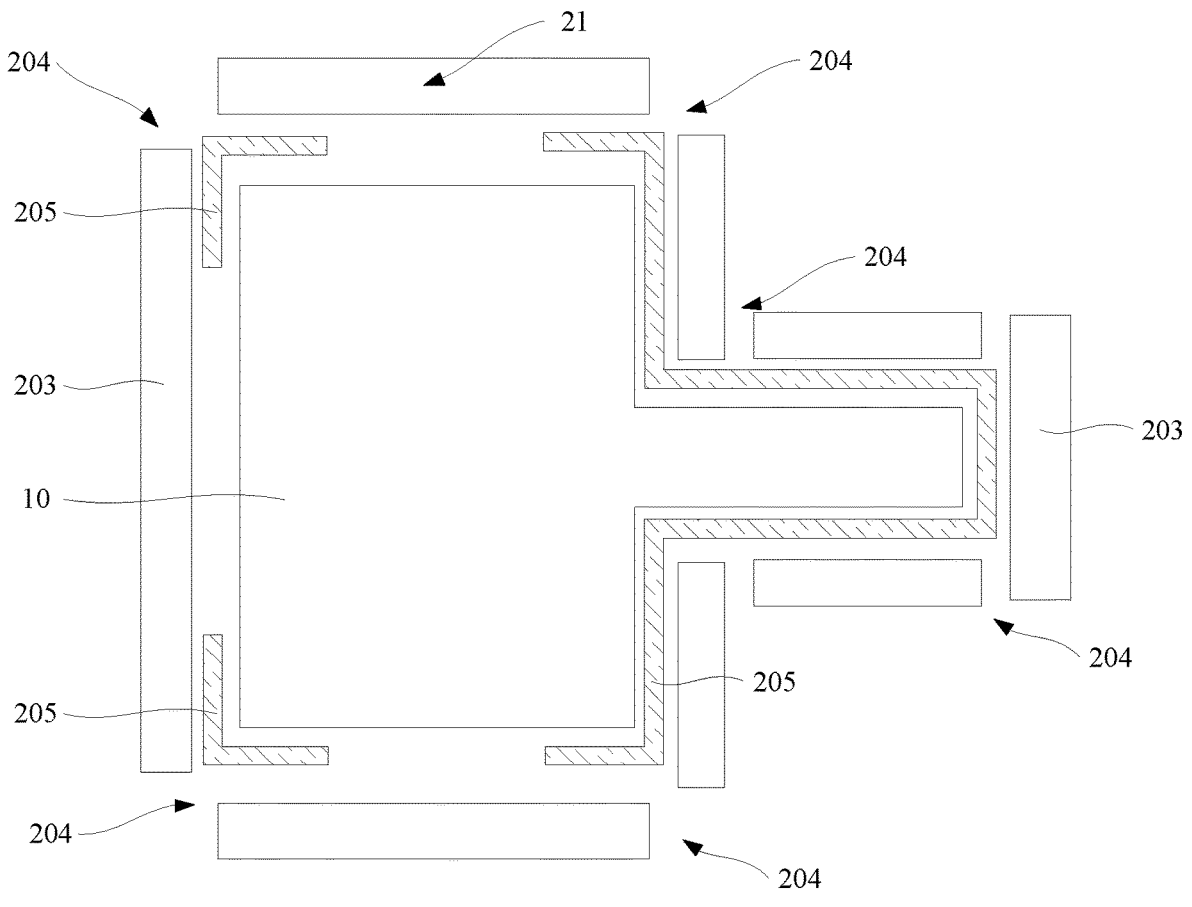
FIG. 13 is a seventh schematic structural diagram when the shielding structure in FIG. 1 includes a plurality of shielding sections.

FIG. 1 is a schematic structural diagram of a power module provided by an embodiment of the present disclosure. FIG. 2 is a schematic structural diagram of a shielding structure in FIG. 1. FIG. 3 is a schematic structural diagram when the shielding structure in FIG. 1 is flexible. FIG. 4 is a first schematic structural diagram when the shielding structure in FIG. 1 includes a rigid shielding section and a flexible shielding section. FIG. 5 is a second schematic structural diagram when the shielding structure in FIG. 1 includes a rigid shielding section and a flexible shielding section. FIG. 6 is a third schematic structural diagram when the shielding structure in FIG. 1 includes a rigid shielding section and a flexible shielding section. FIG. 7 is a first schematic structural diagram when the shielding structure in FIG. 1 includes a plurality of shielding sections. FIG. 8 is a second schematic structural diagram when the shielding structure in FIG. 1 includes a plurality of shielding sections. FIG. 9 is a third schematic structural diagram when the shielding structure in FIG. 1 includes a plurality of shielding sections. FIG. 10 is a fourth schematic structural diagram when the shielding structure in FIG. 1 includes a plurality of shielding sections. FIG. 11 is a fifth schematic structural diagram when the shielding structure in FIG. 1 includes a plurality of shielding sections. FIG. 12 is a sixth schematic structural diagram when the shielding structure in FIG. 1 includes a plurality of shielding sections. FIG. 13 is a seventh schematic structural diagram when the shielding structure in FIG. 1 includes a plurality of shielding sections.

Please refer to FIG. 1 to FIG. 13, the embodiment of the present disclosure provides a power module 1, the power module 1 including: a circuit module 10, having a voltage level; and a cabin 20, configured to wrap the circuit module 10 by bending or splicing, where the cabin 20 has a shielding structure 21, and the shielding structure 21 includes: a first conductor layer 210, the first conductor layer 210 being located at a side close to the circuit module 10 and equipotentially connected to the circuit module 10; a second conductor layer 220, the second conductor layer 220 being arranged apart from the first conductor layer 210 and located at a side away from the circuit module 10; and a solid insulating layer 230, provided between the first conductor layer 210 and the second conductor layer 220 and configured to electrically isolate the first conductor layer 210 and the second conductor layer 220.

Specifically, the power module 1 is applied to a solid-state transformer system for realizing power transmission. The power module 1 includes the cabin 20, and the circuit module 10 and a transformer, etc., provided in the cabin 20. The circuit module 10 and the transformer may both be of types and structures well known to persons with skills in the art, which is not limited in the present embodiment.

The cabin 20 surrounds the circuit module 10 to protect the circuit module 10. The cabin 20 includes the shielding structure 21 and a locking structure for fixing the shielding structure 21 outside the circuit module 10. The locking structure may have different structures according to different fixing methods of the shielding structure 21.

For example, the shielding structure 21 may be fixed on an external surface of the circuit module 10 by a threaded fastener, and then the locking structure may be a metal plate structure provided outside the circuit module 10. Or, the locking structure may include a frame structure 22 surrounding the circuit module 10, the frame structure 22 is connected to the circuit module 10 through a threaded fastener, and the shielding structure 21 is fixed on the frame structure 22, so that there is a preset gap between the cabin 20 and the circuit module 10. Certainly, the shielding structure 21 may also be fixed to the circuit module 10 by welding, or locking, etc., which is not limited in the present embodiment.

The shielding structure 21 includes the solid insulating layer 230, and the first conductor layer 210 and the second conductor layer 220 respectively arranged on two sides of the solid insulating layer 230. A material of the solid insulating layer 230 may be nylon, epoxy resin, silicone resin, polyurethane, polytetrafluoroethylene, silicone rubber, or ceramic, etc., so that the solid insulating layer 230 may have better insulation performance. The first conductor layer 210 and the second conductor layer 220 are made of conductive material, semi-conductive material, or composite material of conductive material and semi-conductive material.

Thickness of the solid insulating layer 230 may be defined according to dielectric strength of the power module 1 and the material of the solid insulating layer 230, which is not limited in the present embodiment. The solid insulating layer 230, the first conductor layer 210, and the second conductor layer 220 may be formed by high temperature pressing, electroplating, sputtering, or spraying, etc.

The first conductor layer 210 is provided on a side of the solid insulating layer 230 close to the circuit module 10 and is configured to be at the same potential as the circuit module 10, so that the first conductor layer 210 can shield an electric field formed by the circuit module 10. And the first conductor layer 210 is fixed and connected to the solid insulating layer 230, so that all positions on an inner surface of the solid insulating layer 230 have the same potential, and discharge between the first conductor layer 210 and the solid insulating layer 230 is avoided. The second conductor layer 220 is provided on a side of the solid insulating layer 230 away from the circuit module 10, and the second conductor layer 220 has a small potential, for example, the second conductor layer 220 is grounded, so that even if a worker touches the power module 1, for example, the worker overhauls the power module 1, the worker will not get an electric shock accident, and the cabin 20 has good insulation performance and high safety.

The shielding structure 21 is a splicing structure or the shielding structure 21 is a bendable structure. When assembling the power module 1, please refer to FIG. 3 to FIG. 6, when the shielding structure 21 is a bendable structure, the shielding structure 21 is wrapped and fixed on the external surface of the circuit module 10 through deformation of a flexible bendable part. When the shielding structure 21 is a splicing structure, please refer to FIG. 7 to FIG. 13, different parts of the shielding structure 21 may be respectively fixed on the external surface of the circuit module 10 to protect the circuit module 10.

That is, when assembling the power module 1, the circuit module 10 may be assembled and formed first, and then the shielding structure 21 may be fixed on the external surface of the circuit module 10. Compared with the assembly method in the prior art where the insulating layer is prefabricated and then the circuit module 10 is assembled in an insulating housing, the power module 1 provided in the present embodiment is not limited by a size and a stacking method of the power module and is easy to assemble. At the same time, it may also reduce dependence on a complex mold when forming the cabin 20 and reduce manufacturing cost.

Please refer to FIG. 3, in some optional implementations, the shielding structure 21 is flexible, that is, the whole shielding structure 21 is a flexible piece which is easy to deform. In this way, when the shielding structure 21 is wrapped on the external surface of the circuit module 10, the shielding structure 21 may be bent and deformed according to a structure of the circuit module 10 and projections or depressions of the external surface of the circuit module 10, facilitating assembly of the power module 1.

The flexible structure may be an integral structure and wrap the circuit module 10 around a circumferential direction of the circuit module 10. Two ends of the flexible shielding structure 21 are fixed and connected to realize "insulation recovery", that is, two ends of the first conductor layer 210 are welded; two ends of the second conductor layer 220 are welded; and two ends of the solid insulating layer 230 are fixed and connected by filling glue.

Please refer to FIG. 4 to FIG. 6, the shielding structure 21 may also be a combination of rigid and flexible structure. In some optional implementations, the shielding structure 21 includes a flexible shielding section 201 and a rigid shielding section 202, and the flexible shielding section 201 and the rigid shielding section 202 are alternately arranged and connected end to end. The rigid shielding section 202 and the flexible shielding section 201 may be integrally formed, or may be fixed and connected by the above-mentioned "insulation recovery" connecting method.

The rigid shielding section 202 has high strength and is not easy to deform. The rigid shielding section 202 may be used as a supporting structure to be fixed and connected to the circuit module 10, and has high support stability. The flexible shielding section 201 is easy to deform. For example, the flexible shielding section 201 may be wrapped on a part of the circuit module 10 with a complicated external surface to reduce manufacturing difficulty of the cabin 20.

For example, please refer to FIG. 4, the rigid shielding section 202 is provided on a bottom side of the circuit module 10 as a supporting component to support the circuit module 10. The flexible shielding section 201 is surrounded at positions of other external surfaces of the circuit module 10. In the present embodiment, extended length and distribution positions of the rigid shielding section 202 and the flexible shielding section 201 are not limited.

That is to say, in order to reduce the manufacturing difficulty of the cabin 20, please refer to FIG. 5 and FIG. 6, in some optional implementations, at least one flexible shielding section 201 is provided at a corner between two adjacent external surfaces of the circuit module 10, so as to arrange the flexible shielding section 201 around a position with a complex external surface of the circuit module 10, for example, an outside of a concave or convex corner. In this way, the rigid shielding section 202 may all have a flat plate-like or bent plate-like structure with relatively simple structure.

When the shielding structure 21 is a splicing structure, please refer to FIG. 7 to FIG. 13, in some optional implementations, the shielding structure 21 includes a plurality of shielding sections 203, the shielding sections 203 are arranged along a circumferential direction of the circuit module 10, and the shielding structure 21 has an opening 204, and the opening 204 is formed between two adjacent shielding sections 203. After the circuit module 10 is assembled, the plurality of shielding sections 203 may be sequentially fixed on different side walls in the circumferential direction of the circuit module 10, making the assembly more convenient.

Since the plurality of shielding sections 203 are separate from each other, after the shielding structure 21 is fixed on the circuit module 10, there is an opening 204 between any two adjacent shielding sections 203, that is, there is a gap between two adjacent shielding sections 203.

And in order to reduce the manufacturing cost, similar to the rigid shielding section 202 mentioned above, the shielding section 203 is usually of a plate-like structure with a relatively simple structure, and in this way, the opening 204 is usually located at a corner between two adjacent external surfaces of the circuit module 10.

In order to provide effective insulation protection for the circuit module 10, in some optional implementations, the power module 10 further includes an insulator 205. The insulator 205 is arranged around the circuit module 10 and at least covers the opening 204, and the insulator 205 is located at each side of the cabin 20.

The insulator 205 may be a sheet structure, which may be made of insulating materials such as a plastic sheet or a mylar sheet, and has good insulation performance and dielectric performance.

The insulator 205 may be provided at an inner side of the shielding structure 21 close to the circuit module 10 or at an outer side of the shielding structure 21 away from the circuit module 10. And when the insulator 205 is provided on the inner side of the shielding structure 21 close to the circuit module 10, the insulator 205 may be attached and fixed on the shielding structure 21 or fixed on the external surface of the circuit module 10, and at this time, there is a preset gap between the insulator 205 and the shielding structure 21, that is, it is only needed that a size of the insulator 205 along the circumferential direction of the circuit module 10 is larger than a size of the opening 204 and the insulator 205 covers the opening 204, so as to satisfy the distance required by safety specifications at the opening 204 and avoid a creepage problem of the circuit module 10 at the opening 204, and the assembly difficulty of the power module 1 may be reduced by splicing the plurality of shielding sections 203 and providing an independent insulator 205.

It can be understood that the circuit module 10 has a plurality of external surfaces along its own circumferential direction, and correspondingly, a plurality of openings 204 may be formed between the plurality of shielding sections 203, and the number of insulators 205 may be the same as the number of openings 204, so that one insulator 205 is correspondingly provided at a position of each gap.

Certainly, please refer to FIG. 8 to FIG. 10, one insulator 205 may also cover a plurality of openings 204 at the same time. For example, the insulator 205 may be annular and is provided between the circuit module 10 and the shielding section 203 or outside the shielding section 203.

Two adjacent shielding sections 203 may be fixed and connected by "insulation recovery", please refer to FIG. 11, in some optional implementations, the cabin 20 further has an insulator 205, provided at the opening 204 and connected between two adjacent shielding sections 203, and the insulator 205 is integrated with the solid insulating layer 230 of the shielding structure 21. That is, at the opening 204 between two adjacent shielding sections 203, the first conductor layer 210 and the second conductor layer 220 are disconnected, and the solid insulating layer 230 is fixed and connected by the insulator 205. At this time, as required, the opening 204 may also be provided with an independent insulator 205 such as a plastic sheet or a mylar sheet.

In this way, in the present embodiment, after the circuit module 10 is assembled and formed, the cabin 20 may be fixed on the external surface of the circuit module 10, which is convenient to assemble and has good insulation performance.

Figure 14:
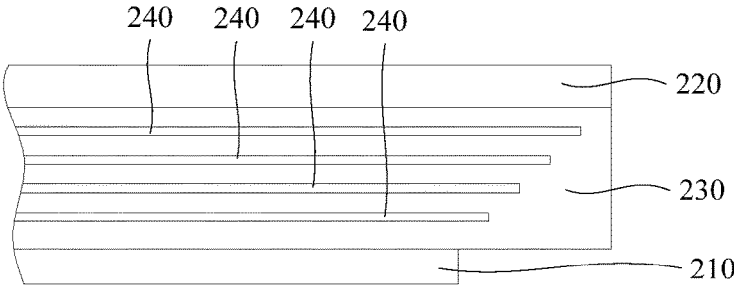
FIG. 14 is a schematic structural diagram when the shielding structure in FIG. 1 is provided with a plurality of third conductor layers.

FIG. 14 is a schematic structural diagram when the shielding structure in FIG. 1 is provided with a plurality of third conductor layers. Please refer to FIG. 14, in some optional implementations, the shielding structure 21 further includes a plurality of third conductor layers 240 arranged at intervals, and the plurality of third conductor layers 240 are located between the first conductor layer 210 and the second conductor layer 220. Ends of the first conductor layer 210, ends of the plurality of third conductor layers 240, and ends of the second conductor layer 220 gradually expand from the side close to the circuit module 10 to the side away from the circuit module 10. Therefore, the first conductor layer 210, the plurality of third conductor layers 240, and the second conductor layer 220 may constitute a capacitive grading layer to improve a dielectric level of the solid insulating layer 230. At the same time, the ends of the first conductor layer 210, the ends of the third conductor layers 240, and the ends of the second conductor layer 220 gradually expand from the side close to the circuit module 10 to the side away from the circuit module 10, that is, for each shielding section 203, length of each conductor layer gradually increases from the side close to the circuit module 10 to the side away from the circuit module 10, so as to equalize the electric field, avoid electric field concentration at the ends of the first conductor layer 210 and the second conductor layer 220, and improve the dielectric level and service life of the solid insulating layer 230.

The number of layers of the third conductor layer 240 is at least two and may be selected according to the dielectric level of the power module 1 and material and thickness of the solid insulating layer 230.

In some optional implementations, please refer to FIG. 7 to FIG. 11, the circuit module 10 has a concave part 11 arranged opposite to the opening 204, so as to avoid the shielding section 203 forming a partial concentrated electric field at the opening 204 and prevent air at the solid insulating layer 230 or the opening 204 from generating partial discharge, and this arrangement may improve an overall partial discharge voltage level of the power module and prolong a service life of the shielding structure 21.

In some optional implementations, the shielding structure 21 further includes a plurality of third conductor layers arranged at intervals, and at least one layer of the plurality of third conductor layers is provided outside the shielding structure 21 and is configured as a signal transmission layer (not shown).

That is to say, there are two types of third conductor layers 240, where one type of third conductor layer 240 is provided between the first conductor layer 210 and the second conductor layer 220, and forms the capacitive grading layer structure with the first conductor layer 210 and the second conductor layer 220, and the capacitive grading layer structure may equalize electric field distribution in the shielding structure 21, which is beneficial to improving the dielectric level of the cabin in the power module and reducing a volume of the power module; the other type of third conductor layer is provided at an outer side of the second conductor layer 220 away from the circuit module 10 or at an outer side of the first conductor layer 210 close to the circuit module 10 and is electrically connected to the circuit module to realize transmission of electrical signals.

The signal transmission layer is provided outside the capacitive grading layer, and the capacitive grading layer may provide equipotential shielding protection for the signal transmission layer, and security of the signal transmission layer is high.

Figure 15:
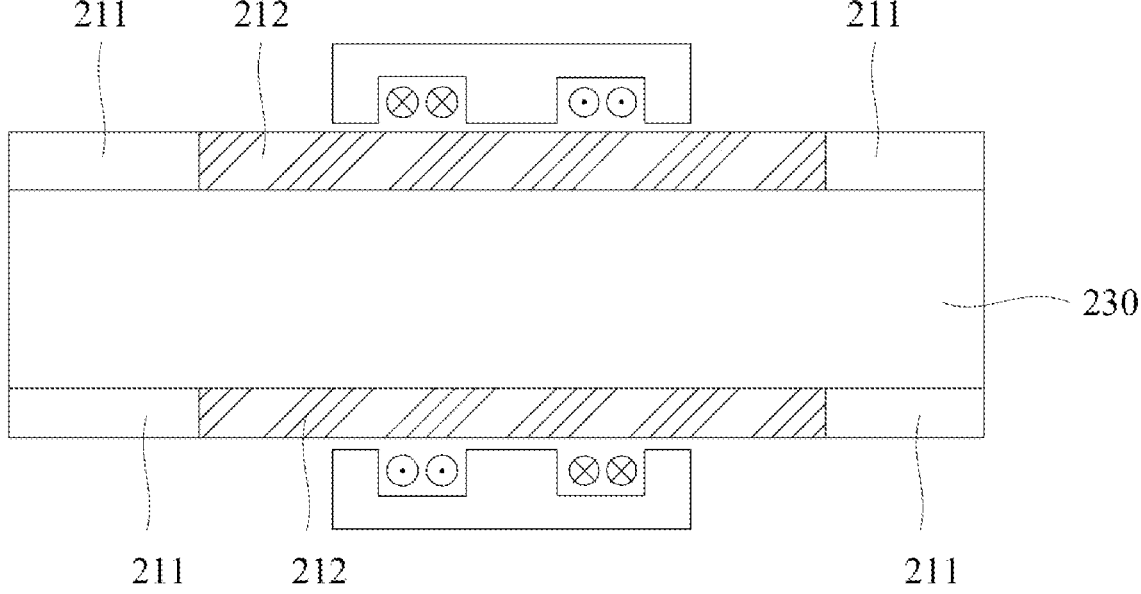
FIG. 15 is a schematic structural diagram of a first conductor layer and a second conductor layer of the shielding structure in FIG. 1.

In some optional implementations, the first conductor layer 210 is a metal layer, a semi-conductive layer, or a composite structure of metal layer and semi-conductive layer. Please refer to FIG. 15. FIG. 15 is a schematic structural diagram of a first conductor layer and a second conductor layer of the shielding structure in FIG. 1. The first conductor layer 210 may be a composite structure of a metal layer 211 and a semi-conductive layer 212. Certainly, it is not limited to this, the first conductor layer 210 may be the metal layer 211 wholly or the semi-conductive layers 212 wholly.

The metal layer 211 may be made of copper, silver, nickel or tin, etc. The metal layer 211 is made of conductive material, and may effectively shield the electric field of the circuit module 10 and improve the dielectric level of the cabin 20.

The semi-conductive layer 212 may be made of carbon powder, carbon fiber, or a mixture of nickel, silver and copper mixed powder and glue solution, and is beneficial to equalizing surface electric field on the inner surface of the shielding structure 21 and improve the dielectric level of the cabin 20. Materials and proportions of the semi-conductive layer 212 may be selected as required.

Please continue to refer to FIG. 15, when the first conductor layer 210 is composed of the metal layer 211 and the semi-conductive layer 212, the metal layer 211 and the semi-conductive layer 212 are located in a same plane. Since resistivity of the semi-conductive layer 212 is greater than resistivity of the metal layer 211, the semi-conductive layer 212 may be located at a position corresponding to the transformer, so that when the alternating magnetic field of the transformer passes through the shielding structure 21, existence of the semi-conductive layer 212 is beneficial to reducing eddy current loss.

In some optional implementations, the second conductor layer is the metal layer 211, the semi-conductive layer 212, or the composite structure of the metal layer 211 and the semi-conductive layer 212. For example, the second conductor layer 220 is the metal layer 211 wholly, or the second conductor layer 220 is the semi-conductive layer 212 wholly, or the second conductor layer 220 is the composite structure of the metal layers 211 and the semi-conductive layer 212.

Composition of the second conductor layer 220 may be the same as or different from composition of the first conductor layer 210, which is not limited in the present embodiment.

In some optional implementations, the cabin 20 is formed by a printed circuit board (PCB) process, that is, the first conductor layer 210 and the second conductor layer 220 may be fixed on the solid insulating layer 230 by bonding, hot extrusion or other processes. In this way, the cabin 20 does not require a casting mold design, and may be formed at one time and produced in a production line. Compare with prior art where the insulating cabin is preformed by casting, the cabin 20 in the present embodiment is formed by a manufacturing process for the printed circuit board, reducing the manufacturing cost and reducing labor intensity of workers.

In the prior art, thickness of the insulating cabin formed by epoxy resin casting is 6 mm-10 mm. In the present embodiment, thickness of the cabin 20 prepared by the PCB process may be 4 mm-5 mm, that is, an insulating cabin with conductor layers on both sides is prepared and formed with the PCB process, which can reduce the thickness of the cabin.

When the shielding structure 21 of the cabin 20 includes rigid shielding sections 202 and flexible shielding sections 201 alternately arranged and connected end to end, an integrated cabin without openings may be prepared by the PCB process, and directly sleeved on the external surface of the circuit module. Certainly, the cabin 20 may also be wrapped on the outside of the circuit module 10, and only one opening 204 is formed, that is, only one opening 204 needs to be insulated, reducing the labor intensity. Certainly, an appropriate cabin structure and installation method thereof may be selected according to specific requirements, which is not limited in the present embodiment.

Figure 16:
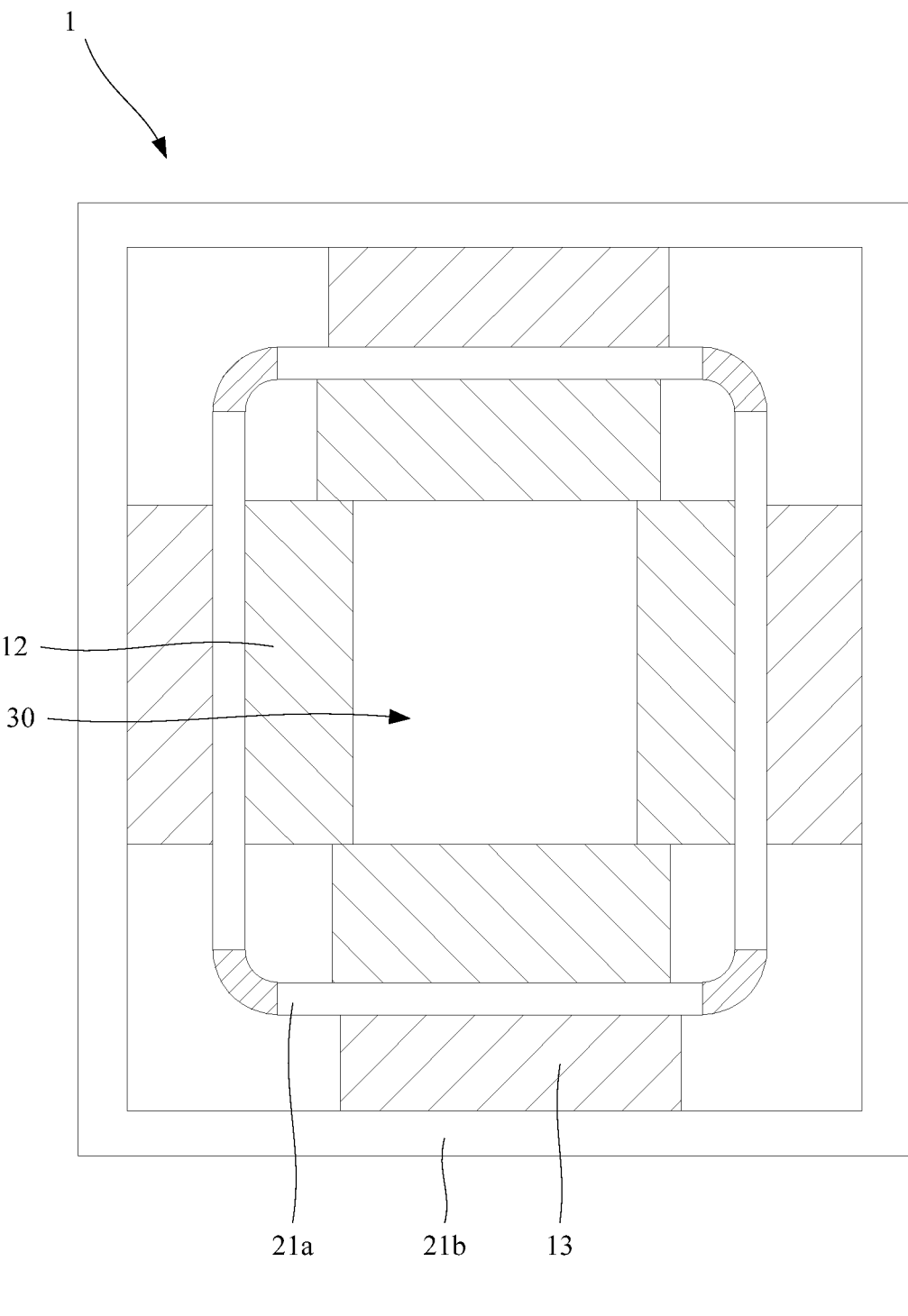
FIG. 16 is a second schematic structural diagram of a power module provided by an embodiment of the present disclosure.
Figure 17:
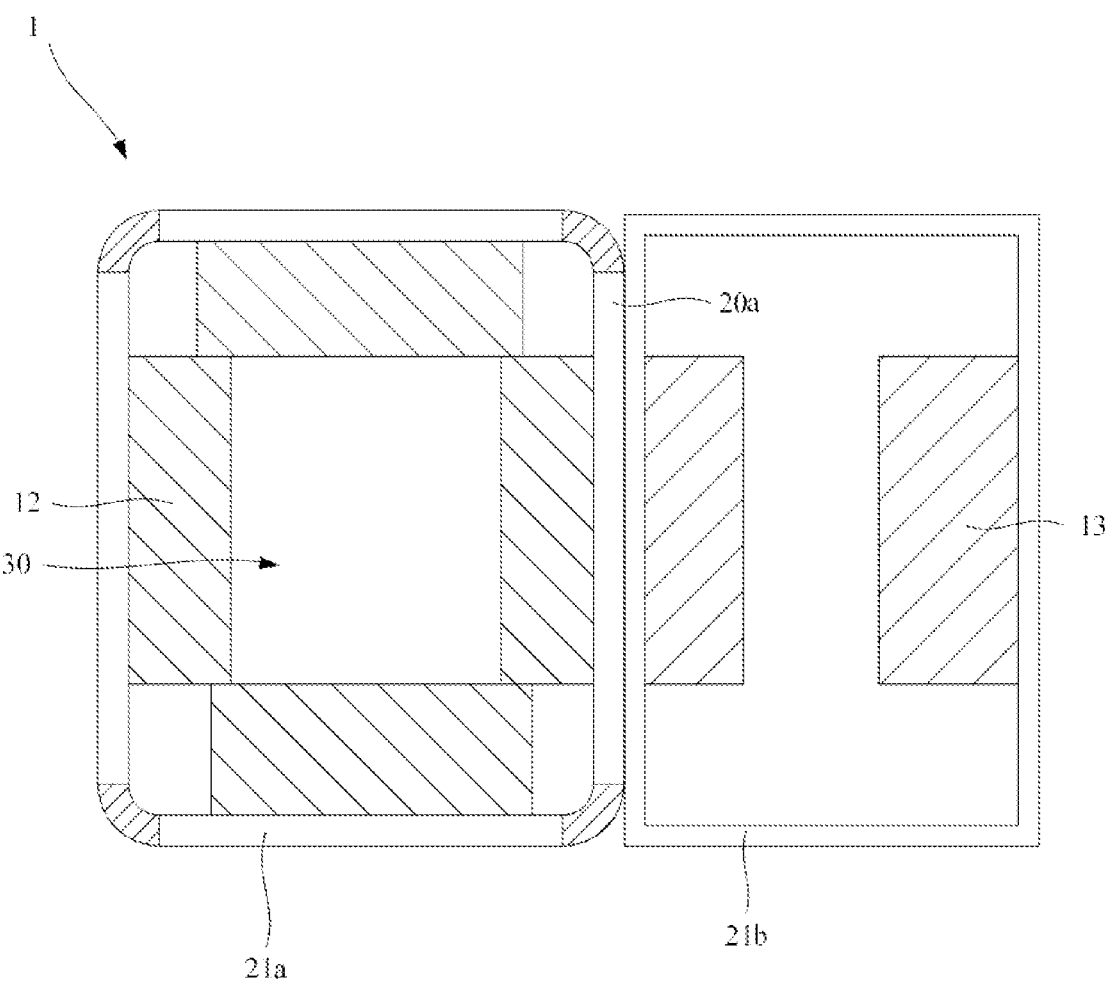
FIG. 17 is a third schematic structural diagram of the power module provided by the embodiment of the present disclosure.
Figure 18:
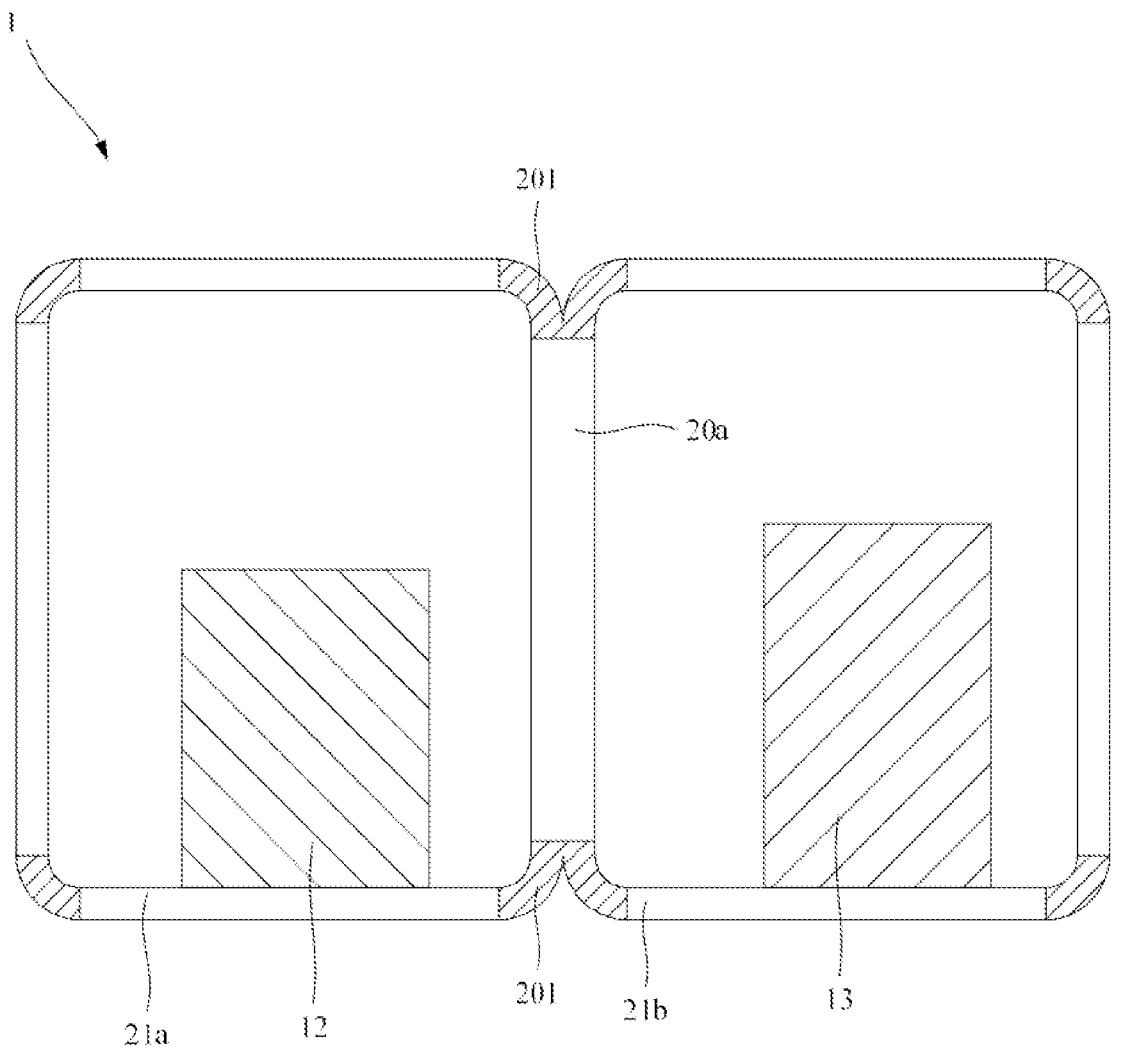
FIG. 18 is a fourth schematic structural diagram of the power module provided by the embodiment of the present disclosure.
Figure 19:
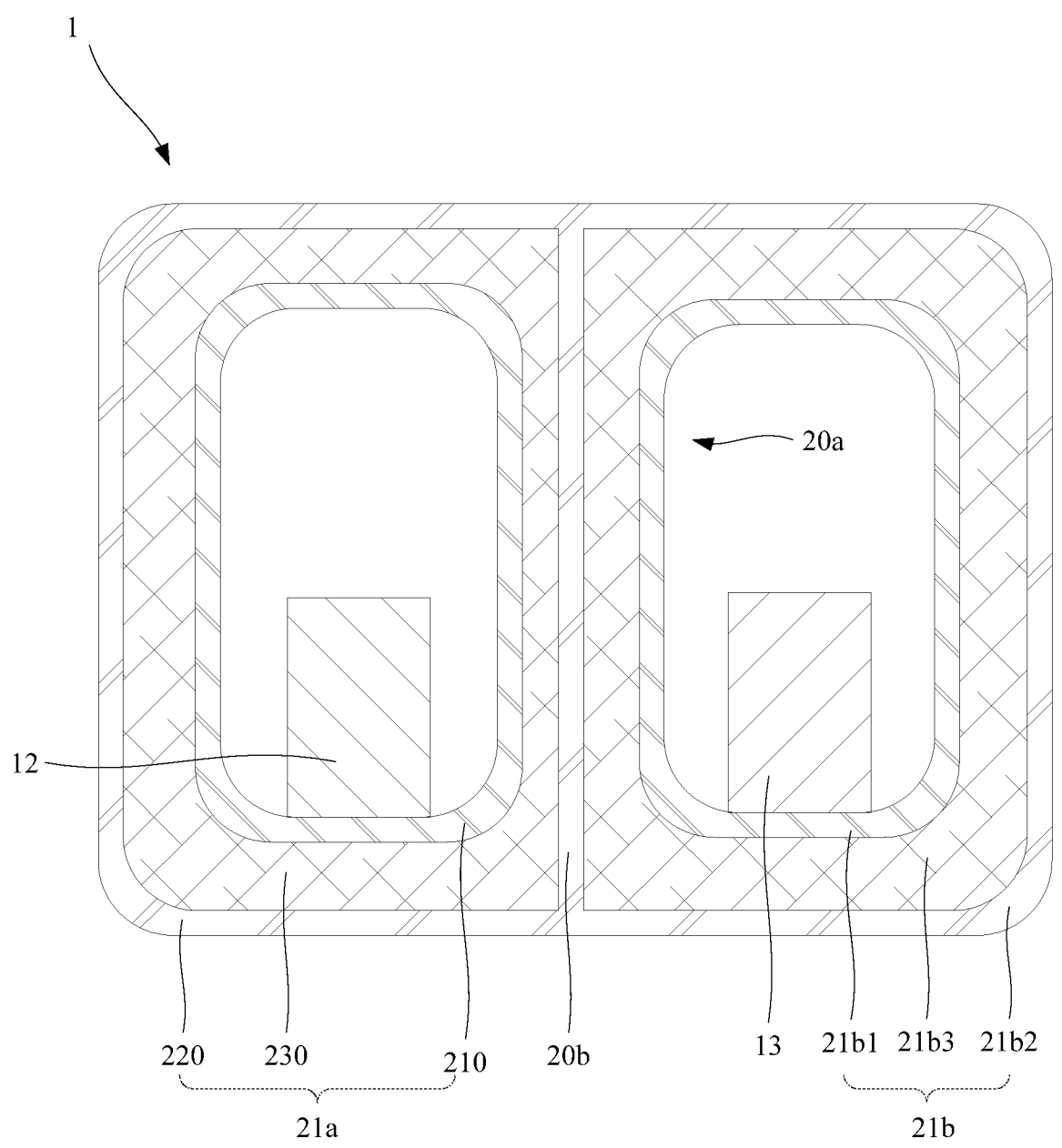
FIG. 19 is a fifth schematic structural diagram of the power module provided by the embodiment of the present disclosure.
Figure 20:
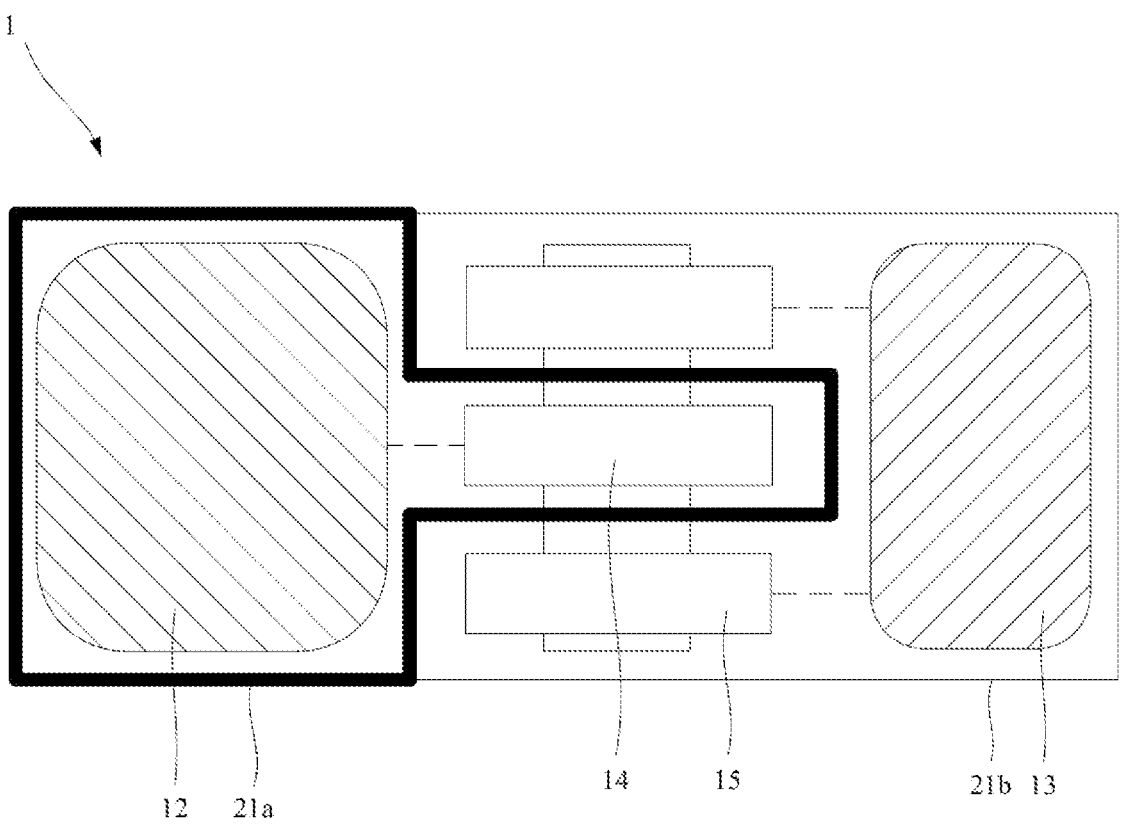
FIG. 20 is a sixth schematic structural diagram of the power module provided by the embodiment of the present disclosure.
Figure 21:
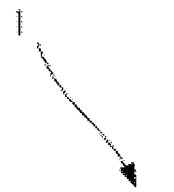
FIG. 21 is a seventh schematic structural diagram of the power module provided by the embodiment of the present disclosure.

FIG. 16 is a second schematic structural diagram of a power module provided by an embodiment of the present disclosure. FIG. 17 is a third schematic structural diagram of the power module provided by the embodiment of the present disclosure. FIG. 18 is a fourth schematic structural diagram of the power module provided by the embodiment of the present disclosure. FIG. 19 is a fifth schematic structural diagram of the power module provided by the embodiment of the present disclosure. FIG. 20 is a sixth schematic structural diagram of the power module provided by the embodiment of the present disclosure. FIG. 21 is a seventh schematic structural diagram of the power module provided by the embodiment of the present disclosure.

Please refer to FIG. 16 to FIG. 21, the embodiments of the present disclosure provides a power module 1, the power module 1 including: a first circuit module 12, having a first voltage level; a first cabin, configured to wrap the first circuit module 12, where the first cabin has a first shielding structure 21a, the structure of the first shielding structure 21a being the same as that of the shielding structure 21 of the power module 1 described above, and the first conductor layer 210 of the first shielding structure 21a is equipotentially connected to the first circuit module 12; and a second circuit module 13, juxtaposed with or surrounding the first circuit module 12, where the second circuit module 13 has a second voltage level, and the second voltage level is lower than the first voltage level.

That is to say, the circuit module 10 includes the first circuit module 12 and the second circuit module 13, and a first cabin surrounds the first circuit module 12, where the first cabin includes the first shielding structure 21a, where the structure and function of the first shielding structure 21a have been described in the above embodiments, which will not be repeated in the present embodiment.

And the second voltage level is lower than the first voltage level, that is, the first circuit module 12 may be understood as a high-voltage circuit module, and the second circuit module 13 may be understood as a low-voltage circuit module. The cabin 20 also includes an insulating part surrounding the second circuit module 13, and the insulating part may be a structure well known to persons with skills in the art, for example, a metal plate box structure.

Please refer to FIG. 17 to FIG. 20, the first circuit module 12 and the second circuit module 13 are juxtaposed, and the first cabin and the insulating part mentioned above are also juxtaposed and surround the first circuit module 12 and the second circuit module 13, respectively. Please continue to refer to FIG. 16, the second circuit module 13 surrounds the first circuit module 12. At this time, the first cabin is provided between the first circuit module 12 and the second circuit module 13, and the insulating part surrounds the second circuit module 13. In the present embodiment, an arrangement form of the first circuit module 12 and the second circuit module 13 is not limited.

In this way, the first circuit module 12 and the second circuit module 13 are at least isolated by the shielding structure 21, and a high voltage winding 14 and a low voltage winding 15 of the transformer are also isolated by the shielding structure 21. It can be understood that thickness of the shielding structure 21 between the first circuit module 12 and the second circuit module 13 is the same as the thickness of the insulating air gap of the transformer. Since the shielding structure 21 is prepared and formed by the printed circuit board process, the present embodiment may control the insulating air gap of the transformer more accurately.

At the same time, the shielding structure may further make an insulating interface between the high voltage winding and the low voltage winding of the transformer have a complicated zigzag design, and may realize a staggered stacking arrangement of the high voltage winding and the low voltage winding while keeping the high voltage and low voltage circuit modules in different cabins and isolated. Therefore, the interface between the high voltage winding and the low voltage winding has multiple insulating structures, which can generate distributed air gaps, and is beneficial to reducing alternative current (AC) loss of the windings. Please refer to FIG. 20, the high voltage winding 14 in the first circuit module 12 may be a protrusion part of the first circuit module 12, and correspondingly, the low voltage winding 15 of the second circuit module 13 forms an accommodating part for accommodating the protrusion part, and the first shielding structure 21a outside the first circuit module 12 may adopt the shielding structure 21 shown in FIG. 6 or FIG. 13, which is not limited in the present embodiment. Therefore, the protrusion part of the first circuit module 12 may be insulated conveniently by alternately arranging and combining the rigid shielding section 202 and the flexible shielding section 201 as shown in FIG. 6, or splicing the plurality of shielding sections 203 as shown in FIG. 13, so that the power module 1 is easy to assemble, and at the same time, the high voltage winding 14 and the low voltage winding 15 of the transformer which are alternately stacked are still in an effective isolation state.

Certainly, the first circuit module 12 and the first shielding structure 21a may further have other cross-sectional shapes, please refer to FIG. 4 to FIG. 6, for example, a triangular cross-sectional shape and a trapezoidal cross-sectional shape, etc., which are not limited in the present embodiment.

In some optional implementations, the power module 1 further includes a second cabin, configured to wrap the second circuit module 13, and the second cabin has a second shielding structure 21b, where the second shielding structure 21b includes: a fourth conductor layer 21b1, where the forth conductor layer 21b1 is located at a side close to the second circuit module 13 and is equipotentially connected to the second circuit module 13; a fifth conductor layer 21b2, where the fifth conductor layer 21b2 is arranged apart from the fourth conductor layer 21b1 and located at a side away from the second circuit module 13; and an insulating layer 21b3, provided between the fourth conductor layer 21b1 and the fifth conductor layer 21b2, and configured to electrically isolate the fourth conductor layer 21b1 and the fifth conductor layer 21b2.

That is, the second circuit module 13 is also insulated and protected by the second shielding structure 21*b*, where the structure and function of the second shielding structure 21*b* are the same as the structure and function of the first shielding structure 21*a* described above, which will not be repeated in the present embodiment.

In some optional implementations, the first shielding structure 21*a* includes a plurality of first shielding sections, and the second shielding structure 21*b* includes a plurality of second shielding sections.

That is, the first shielding structure 21*a* and the second shielding structure 21*b* may both be splicing structures. The plurality of first shielding sections surrounds the first circuit module 12, and openings between two adjacent first shielding sections are insulated by insulators; and the plurality of second shielding sections surrounds the second circuit module 13, and openings between two adjacent second shielding sections are insulated by insulators.

Or, the first shielding structure 21*a* and the second shielding structure 21*b* may also be flexible pieces, or formed by alternately arranging rigid shielding sections and flexible shielding sections. Structural compositions of the first shielding structure 21*a* and the second shielding structure 21*b* may be the same or different, which are not limited in the present embodiment.

In some optional implementations, the first cabin and second cabin are juxtaposed, and there is a common part shared by the first cabin and the second cabin.

In some optional implementations, the first cabin and the second cabin provided side by side may have a specific forming method. Please refer to FIG. 18, the first shielding structure 21*a* and the second shielding structure 21*b* have a common part 20*a*. Each of two ends of the common part 20*a* is connected to two flexible shielding sections 201. Two adjacent flexible shielding sections 201 arranged mirror-symmetrically may form a Y type, so as to be connected to the first shielding structure 21*a* and the second shielding structure 21*b* respectively. At this time, the common part 20*a* may be rigid and play a supporting role, thus the whole cabin structure of the power module has high stability. In addition, the second conductor layer 220 of the first shielding structure 21*a* and the second conductor layer 220 of the second shielding structure 21*b* may be connected to form an integral outer conductor layer.

In some optional implementations, the common part may also have a common conductor layer, where the common conductor layer may be electrically coupled to a reference potential, and a voltage of the reference potential is between the first voltage level and the second voltage level. Please refer to FIG. 19, a common conductor layer 20*b* is provided in the common part 20*a*, and the shielding structure may be divided into two parts, a solid insulating layer 230 and an insulating layer 21*b*3, for voltage division. Furthermore, according to the dielectric breakdown theory, the smaller the thickness of the insulating medium is, the higher the dielectric strength per unit thickness is. That is, the solid insulating layer 230 and the insulating layer 21*b*3 have better insulation performance than a solid insulating layer without a common conductor layer. Therefore, the sum of thicknesses of the solid insulating layer 230 and the insulating layer 21*b*3 is smaller than the thickness of the solid insulating layer when the common conductor layer 20*b* is not provided, that is, insulation thickness between the first circuit module 12 and the second circuit module 13 is reduced, overall weight of the cabin of the power module 1 is reduced, and weight of the power module is reduced. The reference potential of the common conductor layer 20*b* may be any value between the first voltage level and the second voltage level, for example, a voltage value of the reference potential is equal to half of the sum of the first voltage level and the second voltage level.

In some optional implementations, please continue to refer to FIG. 19, the common conductor layer 20*b* may be connected to the outer conductor layer, and the common conductor layer 20*b* and the outer conductor layer have the same potential, that is, the second conductor layer 220 of the first shielding structure 21*a* and the fifth conductor layer 21*b*2 of the second shielding structure 21*b* merge into the common conductor layer 20*b* when passing through the common part 20*a*.

In some optional implementations, two ends of the first cabin are casted with insulating glue and provided with a vent hole, and the vent hole is configured to form an air duct 30 in the first cabin.

That is, the first cabin may be of a cylindrical structure with both ends open, and insulating casting is filled for the space at both ends of the first cabin except the vent holes, and the vent holes are used to form the air duct in the first cabin. Please refer to FIG. 16, FIG. 17, and FIG. 21, the first circuit module 12 is distributed on the internal surface of the first cabin along a circumferential direction of the first cabin, in this way, a cavity enclosed by the first circuit modules 12 is the air duct 30. Cold air may enter the air duct 30 from one end of the air duct 30. After exchanging heat with the first circuit modules 12, the cold air changes into hot air. Then, the hot air is discharged from the other end of the air duct 30, realizing heat dissipation of the first circuit modules 12.

In order to facilitate circulation of the cold air, a cooling fan may further be provided at a port of the air duct 30.

It can be understood that since the first cabin has the cylindrical structure with both ends open, the first circuit module 12 is directly exposed at openings at both ends of the first cabin, that is, the first circuit module 12 is flush with end faces of the first cabin. In the present embodiment, insulating glue is poured at both end faces of the first cabin. In the prior art, the first circuit module 12 has a preset safety distance by increasing length of the first cabin. In the present embodiment, by pouring insulating glue, the safety distance may be saved, the length of the first cabin is smaller, and power density of the power module 1 is larger.

In some optional implementations, an annular baffle (not shown) is further provided at both ends of the first cabin, and the annular baffle extends along the circumferential direction of the first cabin for shielding and covering the first circuit module 12. In this way, only the air duct 30 is exposed in a visual field along an extending direction of the air duct 30, so that the length of the first cabin may be reduced and the power density of the power module 1 may be improved.

In some optional implementations, the power module 1 further includes a heat sink 40. Please continue to refer to FIG. 21, the heat sink 40 is provided in the first cabin and exposed in the air duct 30, and the first circuit module 12 is provided around the heat sink 40.

The heat sink 40 may be a heat radiation fin well known to persons with skills in the art, and the first circuit module 12 surrounds the heat radiation fin. In this way, a contact area between cold air and the heat radiation fin in the first circuit module 12 is large, which is beneficial to realizing heat exchange between the cold air and the heat radiation fin, so as to effectively reduce temperature of the first circuit module 12. It can be understood that only the heat sink 40 is exposed at the opening of the annular baffle along the extending direction of the air duct 30.

In order to improve the insulation performance of the power module 1, the heat sink 40 may be made of non-conductive material, or an insulating material which is easy to conduct heat is coated on an external surface of the heat sink, such as thermally conductive silicone, thermally conductive silicone grease, etc.

An embodiment of the present disclosure provides a solid-state transformer system (not shown), including the above-mentioned power module 1.

The structure and function of the power module 1 have already been described in the above embodiments, which will not be repeated in the present embodiment.

By adopting the above shielding structure, the power module 1 in the solid-state transformer system may provide a better insulation protection for the circuit module 10, and the shielding structure may wrap the circuit module 10 by bending or splicing, which is easy to assemble and reduces the manufacturing cost for fixing the transformer system.

Compared with the prior art, the power module and the solid-state transformer system provided by the embodiments of the present disclosure have at least following advantages: the power module includes a cabin and a circuit module provided in the cabin. The cabin has a shielding structure, and the shielding structure has a solid insulating layer used to protect the circuit module, where a first conductor layer is provided at an inner side of the solid insulating layer, and the first conductor layer is electrically coupled to the circuit module, so that the circuit module in the cabin is shielded by an equipotential charged body, and air in the circuit module can be prevented from being broken down to discharge; and a second conductor layer is provided at an outer side of the solid insulating layer, the second conductor layer may be but is not limited to being grounded, and the second conductor layer is beneficial to improving safety factor of the whole power module when grounded.

In addition, the cabin may wrap the circuit module by bending or splicing, that is, the cabin has a splicing structure or the cabin is bendable. Therefore, when the power module is assembled, an internal circuit module can be installed first, and then the cabin can be assembled and fixed on an external surface of the circuit module or wrapped on the external surface of the circuit module, increasing freedom of installation of the power module.

In the present specification, various embodiments or implementations are described in a progressive method, and each embodiment focuses on differences from other embodiments, thus it is sufficient to refer to the same and similar parts among the embodiments.

In the descriptions of the present specification, descriptions with reference to terms "an embodiment", "some embodiments", "illustrative embodiments", "examples", "specific examples", "some examples", etc., mean that specific features, structures, materials or characteristics described in conjunction with embodiments or examples are included in at least one embodiment or example of the present disclosure. In the present specification, illustrative expressions of the above terms do not necessarily refer to the same embodiments or examples. Furthermore, the specific features, structures, materials or characteristics described may be combined in any one or more embodiments or examples in a suitable method.

Finally, it should be noted that the above embodiments are only used to describe technical solutions of the present disclosure, but not to limit it; although the present disclosure has been described in detail with reference to the foregoing embodiments, persons with ordinary skills in the art should understand that the technical solutions described in the foregoing embodiments may still be modified, or some or all of the technical features may be equivalently substituted; however, these modifications or substitutions do not make essence of corresponding technical solutions deviate from the scope of the technical solutions of various embodiments of the present disclosure.

What is claimed is:

1. A power module, comprising:
   a circuit module, having a voltage level; and
   a cabin, configured to wrap the circuit module by bending or splicing, wherein the cabin has a shielding structure, the shielding structure comprising:
   a first conductor layer, the first conductor layer being located at a side close to the circuit module and equipotentially connected to the circuit module;
   a second conductor layer, the second conductor layer being arranged apart from the first conductor layer and located at a side away from the circuit module; and
   a solid insulating layer, provided between the first conductor layer and the second conductor layer and configured to electrically isolate the first conductor layer and the second conductor layer,
   wherein the shielding structure further comprises a plurality of third conductor layers arranged at intervals, and at least one layer of the plurality of third conductor layers is arranged outside the shielding structure and is configured as a signal transmission layer.

2. The power module according to claim 1, wherein the shielding structure is flexible.

3. The power module according to claim 1, wherein the shielding structure comprises a flexible shielding section and a rigid shielding section, and the flexible shielding section and the rigid shielding section are alternately arranged and connected end to end.

4. The power module according to claim 3, wherein at least one of the flexible shielding section is arranged at a corner between two adjacent external surfaces of the circuit module.

5. The power module according to claim 1, wherein the shielding structure comprises a plurality of shielding sections, the plurality of shielding sections being arranged along a circumferential direction of the circuit module, and the shielding structure has an opening, the opening being formed between two adjacent shielding sections.

6. The power module according to claim 5, wherein the opening is located at a corner between two adjacent external surfaces of the circuit module.

7. The power module according to claim 6, wherein the circuit module has a concave part arranged opposite to the opening.

8. The power module according to claim 5, wherein,
   the power module further comprises an insulator, the insulator is provided around the circuit module and at least covers the opening, and the insulator is located at each side of the cabin, or
   the cabin further has an insulator, provided at the opening and connected between two adjacent shielding sections, and the insulator is integrated with the solid insulating layer of the shielding structure.

9. The power module according to claim 1, wherein the first conductor layer is a metal layer, a semi-conductive layer, or a composite structure of metal layer and semi-conductive layer, and
   the second conductor layer is a metal layer, a semi-conductive layer, or a composite structure of metal layer and semi-conductive layer.

10. The power module according to claim 1, wherein the cabin is formed by a printed circuit board process.

11. A power module, comprising:

a first circuit module, having a first voltage level;

a first cabin, configured to wrap the first circuit module, wherein the first cabin has a first shielding structure, the first shielding structure being the shielding structure of the power module according to claim 1, and the first conductor layer of the first shielding structure is equipotentially connected to the first circuit module; and a second circuit module, juxtaposed with or surrounding the first circuit module, wherein the second circuit module has a second voltage level, and the second voltage level is lower than the first voltage level.

12. The power module according to claim 11, wherein the power module further comprises a second cabin, configured to wrap the second circuit module, and the second cabin has a second shielding structure, wherein the second shielding structure comprises:

a fourth conductor layer, the fourth conductor layer being located at a side close to the second circuit module and equipotentially connected to the second circuit module;

a fifth conductor layer, the fifth conductor layer being arranged apart from the fourth conductor layer and located at a side away from the second circuit module; and an insulating layer, provided between the fourth conductor layer and the fifth conductor layer and configured to electrically isolate the fourth conductor layer and the fifth conductor layer.

13. The power module according to claim 12, wherein the first cabin and the second cabin are juxtaposed, and there is a common part between the first cabin and the second cabin.

14. The power module according to claim 13, wherein the common part has a common conductor layer, the common conductor layer is electrically coupled to a reference potential, and a voltage of the reference potential is between the first voltage level and the second voltage level.

15. The power module according to claim 13, wherein the first shielding structure comprises a plurality of first shielding sections and the second shielding structure comprises a plurality of second shielding sections.

16. The power module according to claim 15, wherein the common part is rigid and is connected between two flexible first shielding sections and two flexible second shielding sections.

17. The power module according to claim 11, wherein two ends of the first cabin are casted with insulating glue and provided with a vent hole, and the vent hole is configured to form an air duct in the first cabin.

18. The power module according to claim 17, wherein the power module further comprises a heat sink, provided in the first cabin and exposed to the air duct, and the first circuit module is arranged around the heat sink.

19. A solid-state transformer system, comprising the power module according to claim 11.

* * * * *